(12) United States Patent
Kim et al.

(10) Patent No.: US 11,882,715 B2
(45) Date of Patent: Jan. 23, 2024

(54) DISPLAY DEVICE HAVING TRANSMISSION PORTION AND EMISSION PORTION WITH CAPPING STACK FORMED THEREON

(71) Applicant: LG Display Co., Ltd., Seoul (KR)

(72) Inventors: Jae-Hyeon Kim, Paju-si (KR); Seok-Hyun Kim, Seoul (KR); Kwan-Soo Kim, Seoul (KR); Young-Nam Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 233 days.

(21) Appl. No.: 17/011,920

(22) Filed: Sep. 3, 2020

(65) Prior Publication Data
US 2021/0074945 A1    Mar. 11, 2021

(30) Foreign Application Priority Data

Sep. 5, 2019  (KR) .......................... 10-2019-0109924

(51) Int. Cl.
*H10K 50/844* (2023.01)
*H10K 50/818* (2023.01)
*H10K 50/125* (2023.01)

(52) U.S. Cl.
CPC ......... *H10K 50/818* (2023.02); *H10K 50/125* (2023.02); *H10K 50/844* (2023.02)

(58) Field of Classification Search
CPC .. H01L 51/5237–51/5259; H01L 33/08; H01L 27/326
See application file for complete search history.

(56) References Cited

U.S. PATENT DOCUMENTS

2017/0330923 A1\* 11/2017 Chung ................ H01L 27/1248
2019/0355793 A1\* 11/2019 Oh ....................... H10K 59/122

FOREIGN PATENT DOCUMENTS

KR          10-1829890 B1    2/2018

\* cited by examiner

*Primary Examiner* — Daniel Whalen
(74) *Attorney, Agent, or Firm* — Seed IP Law Group LLP

(57) ABSTRACT

Disclosed is a display device which may display images in a transmission portion, and may improve uniformity of a display in both the emission portion and the transmission portion, thus may improve efficiency of a device and improve a lifespan.

20 Claims, 17 Drawing Sheets

DISPLAY DEVICE HAVING TRANSMISSION PORTION AND EMISSION PORTION WITH CAPPING STACK FORMED THEREON

CROSS-REFERENCE TO RELATED APPLICATION

This application claims the benefit of Korean Patent Application No. 10-2019-0109924, filed Sep. 5, 2019, which is hereby incorporated by reference as if fully set forth herein.

BACKGROUND

Technical Field

The present disclosure relates to a display device, and more particularly, to a display device which has improved an efficiency of a device and a life span. The display device is possible to display an image in a transmission portion with an emission portion and to improve uniformity of a display in the emission portion and the transmission portion by changing a structure of a capping layer.

Description of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

Thereamong, self-luminous display devices which do not require separate light sources and achieve compactness and clear color display, such as an organic light emitting diode display device and a quantum dot display device, are considered as competitive applications.

A self-luminous display device includes a plurality of pixels over a substrate, and each pixel includes a light emitting diode including an anode and a cathode disposed opposite to each other and a light emitting layer provided between the anode and the cathode.

Since the self-luminous display device displays an image using light emitted by the light emitting diodes, it is beneficial to effectively use light extracted from the light emitting diodes. Therefore, an effort to reduce the thickness of the cathode located in a light emitting direction so as to increase transmittance and an effort to raise reliability of the cathode and elements disposed adjacent thereto so as to stabilize performance of the display device have been made.

In a top emission structure which is used now, for example, an anode of a light emitting device includes a reflective metal, and a cathode of the light emitting device includes a transflective metal. Therefore, light emitted from a light emitting layer located between the anode and the cathode is reflected by the reflective anode and resonates plural times between the anode and the cathode, and light of a specific wavelength according to a distance between the anode and the cathode is emitted. In such a structure, in order to further increase transmittance, an effort to reduce the thickness of the cathode is made.

Further, demand for a transparent display device which may transmit light through front and rear surfaces thereof and display an image without obstruction of a visual field is increasing now.

The transparent display device varies disposition of light emitting diodes in a self-luminous area and a transmission portion and may thus acquire both a transparent display effect and a luminous display effect.

However, since the self-luminous area and the transmission portion respectively regard increase in luminous efficiency and transmittance as important, the self-luminous area and the transmission portion have different purposes and thus require different structures, and thereby it is difficult to implement the self-luminous area and the transmission portion with a common structure.

That is, it is difficult for transparent display devices which have been proposed up to now, to have high transmittance and uniform color efficiency according to wavelength.

BRIEF SUMMARY

Accordingly, the present disclosure is directed to a transparent display device that substantially obviates one or more problems due to limitations and disadvantages of the related art.

The present disclosure provides a display device which may display images even in a transmission portion with an emission portion, and may improve uniformity of a display in both of the emission portion and the transmission portion, thus may improve efficiency of a device and improve a lifespan.

Additional advantages, technical benefits, and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these technical benefits and other advantages and in accordance with the purpose of the disclosure, as embodied and broadly described herein, a display device includes a first capping structure having destructive interference properties in a transmission portion and a second capping structure having constructive interference properties in an emission portion. So the emission portion maintains improved or strong cavity properties and emits light generated from a light emitting element, and the transmission portion reduces amount of light totally reflected inside in the first capping structure and increases light transmittance by having reflective properties at an interface of the first capping structure.

A display device according to an embodiment of the present disclosure may comprise a plurality of emission portions and a plurality of transmission portions on a substrate, a light emitting layer in the emission portions, a reflective electrode structure between the light emitting layer and the substrate, in each of the emission portions, a transmissive electrode located over the light emitting layer throughout the emission portions and the transmission portions of the substrate and a capping stack on the transmissive electrode, the capping stack comprising a first capping structure over the transmission portion and a second capping structure over the emission portion, the second capping structure different from the first capping structure.

A display device according to a different embodiment of the present disclosure may include a plurality of red emission portions, a plurality of green emission portions, a plurality of blue emission portions and a plurality of transmission portions on a substrate, a bank among the red emission portions, the green emission portions, the blue emission portions and the transmission portions, a light emitting element in each of the red emission portions, the green emission portions, and the blue emission portions, the light emitting element having a reflective electrode structure, a light emitting layer and a transmissive electrode, a passing electrode in each of the transmission portions, the passing electrode extended from the transmission electrode and a capping stack on the transmissive electrode and the passing electrode, the capping stack comprising a first capping structure over at least part of the transmission portions and a second capping structure over at least part of the red emission portions, the green emission portions, and the blue emission portions, the second capping structure different from the first capping structure.

It is to be understood that both the foregoing general description and the following detailed description of the present disclosure are explanatory and are intended to provide further examples and explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
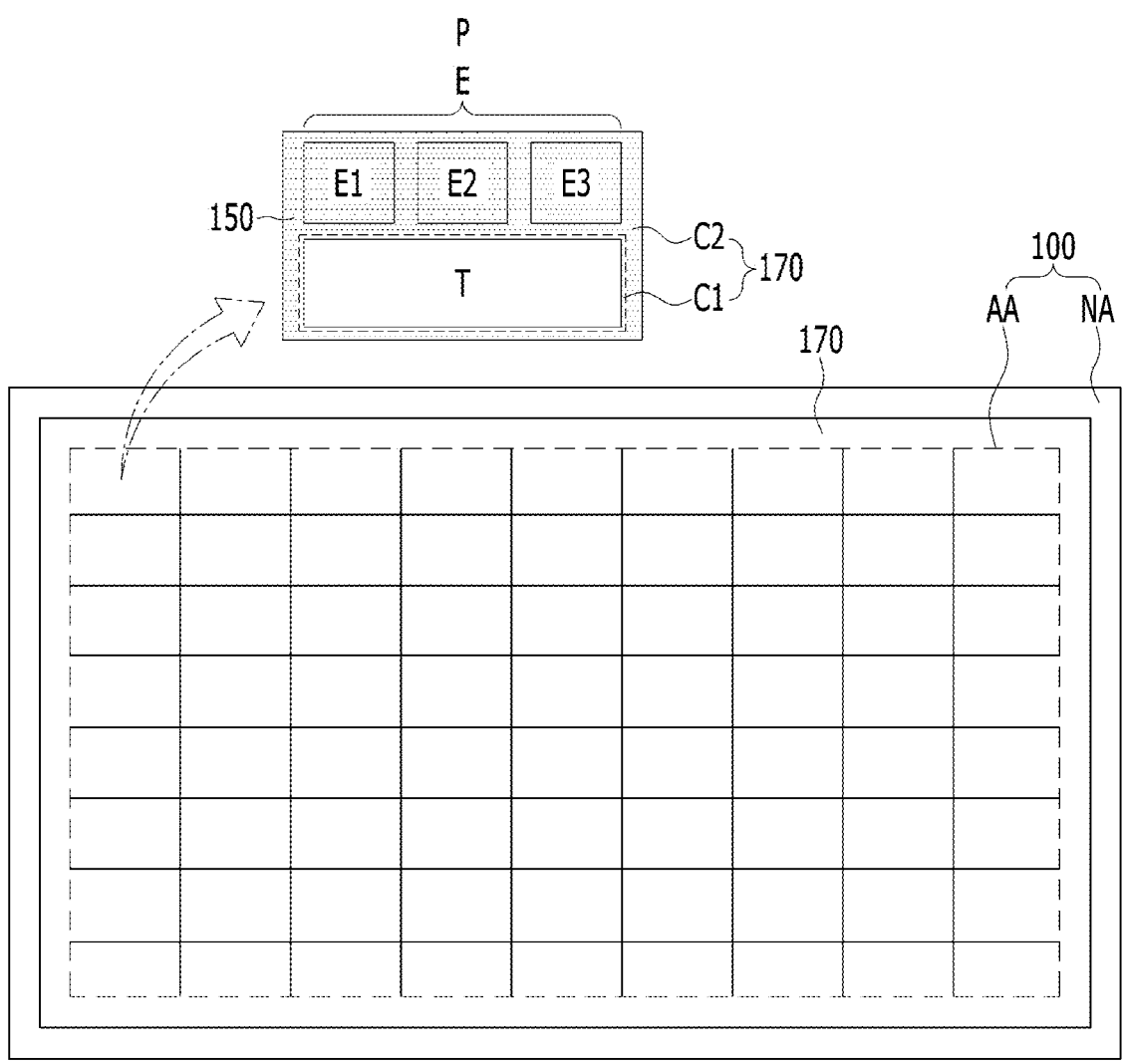
FIG. 1 is a plan view of a display device in accordance with the present disclosure.

Reference will now be made in detail to the preferred embodiments of the present disclosure, examples of which are illustrated in the accompanying drawings. However, the present disclosure may be embodied in many alternative forms and should not be construed as limited to the embodiments set forth herein, and the embodiments of the present disclosure are provided only to completely disclose the disclosure and to completely inform those skilled in the art of the scope of the disclosure. Further, the names of elements used in the following description of the embodiments of the present disclosure are selected in consideration of ease in preparation of the specification, and may thus differ from the names of parts of an actual product.

Shapes, sizes, rates, angles, numbers, etc., disclosed in the drawings to describe the embodiments of the present disclosure are only for examples and do not limit the present disclosure. In the following description of the embodiments and the drawings, the same or similar elements are denoted by the same reference numerals even though they are depicted in different drawings. In the following description of the embodiments of the present disclosure, a detailed description of known functions and configurations incorporated herein will be omitted when it may make the subject matter of the present disclosure rather unclear. In the following description of the embodiments, the terms 'including,' 'having,' etc., will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element encompasses a plural expression of the element unless stated otherwise.

In interpretation of elements included in the various embodiments of the present disclosure, it will be interpreted that the elements include error ranges even if there is no clear statement.

In the following description of the embodiments, it will be understood that, when positional relations are expressed, for example, when an element is 'on,' 'above,' 'under,' 'beside,' etc., another element, the two elements may directly contact each other, or one or more other elements may be interposed between the two elements unless the term 'just' or 'directly' is used.

In the following description of the embodiments, it will be understood that, when temporal relations are expressed, for example, a term expressing a sequence of events, such as 'after,' 'subsequent to,' next to' or 'before' may encompass continuous relationship between the events, or discontinuous relationship between the events unless the term 'just' or 'directly' is used.

In the following description of the embodiments, it will be understood that, when the terms 'first,' 'second,' etc., are used to describe various elements, these terms are used merely to discriminate the same or similar elements. Therefore, an element modified by the term 'first' may be the same as an element modified by the term 'second' within the technical scope of the disclosure unless stated otherwise.

Characteristics of the various embodiments of the present disclosure may be partially or entirely connected to or combined with each other and technically variously driven and interlocked with each other, and the respective embodiments may be independently implemented or be implemented together in connection with each other.

Figure 2A:
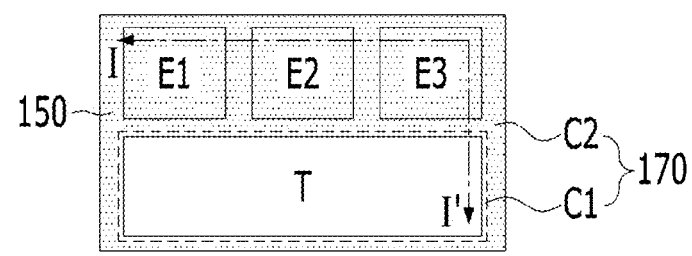
FIG. 2A is a plan view of a display device in accordance with first embodiment of the present disclosure.
Figure 2B:
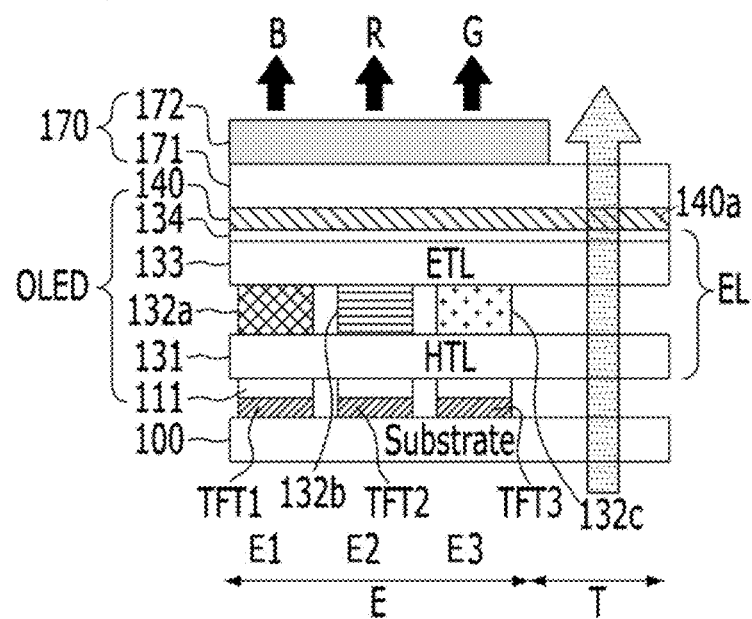
FIG. 2B is a cross-sectional view of FIG. 2A, taken along line I-I'.
Figure 2C:
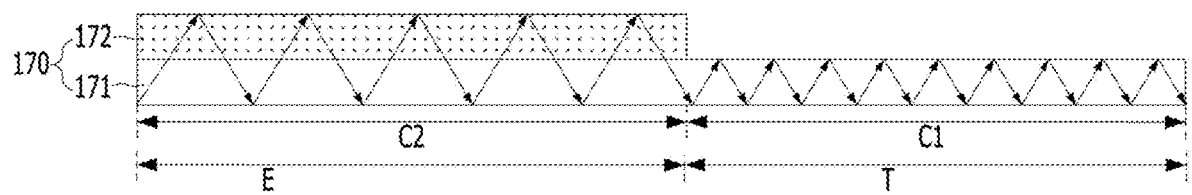
FIG. 2C is a view illustrating principles of resonance of the capping stack.
Figure 3:
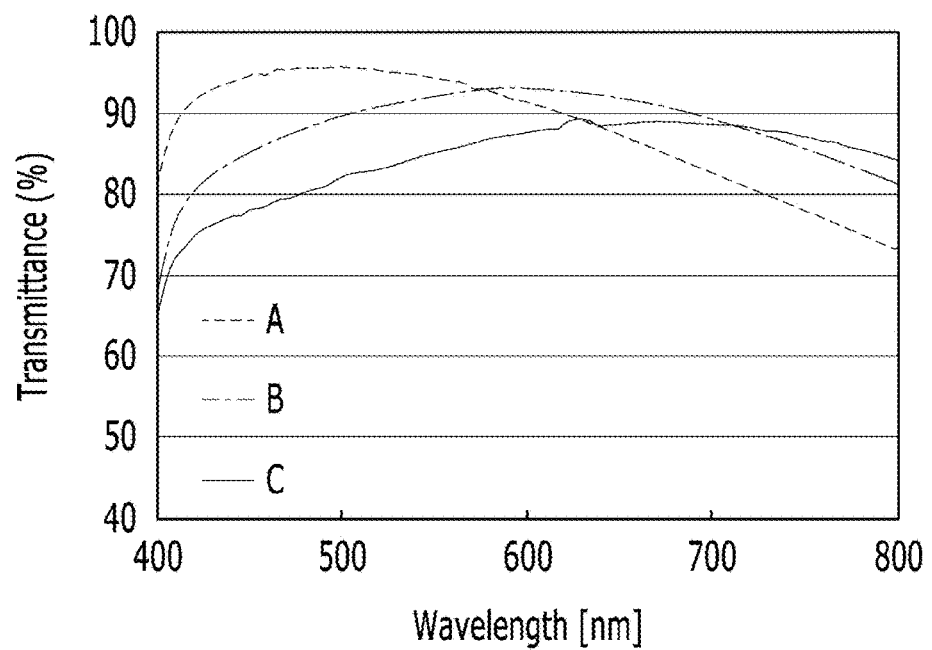
FIG. 3 is a graph illustrating transmittances according to wavelength when capping layer structures of the first to third experimental examples are applied in the transmission portion of the display device of FIG. 2B.
Figure 4:
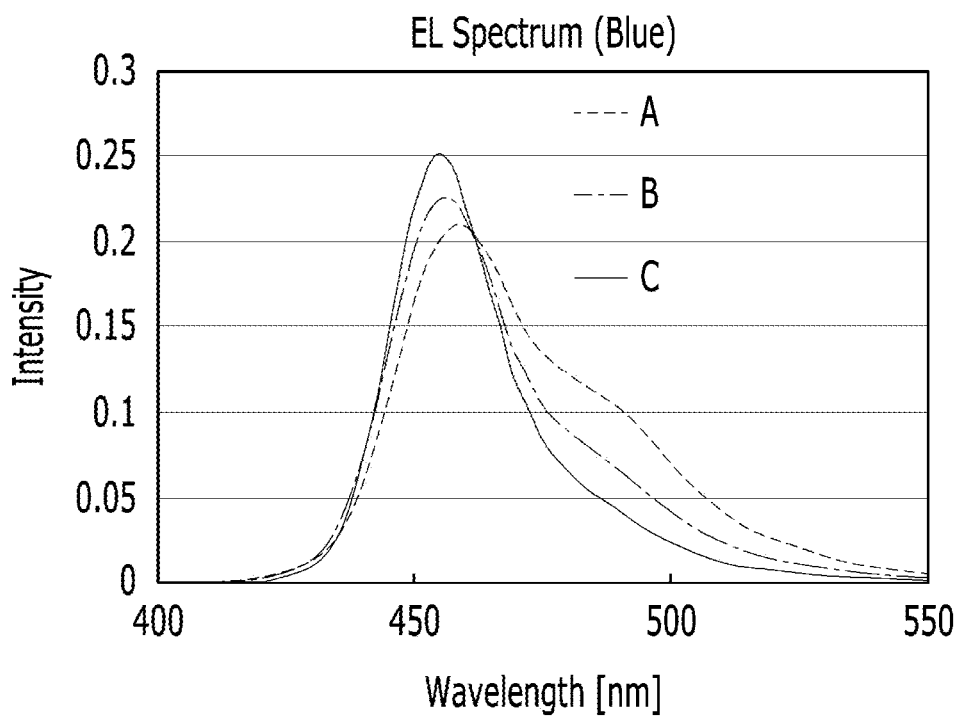
FIG. 4 is a graph illustrating EL spectrums (blue wavelength) when capping layer structures of the first to third experimental examples are applied in the transmission portion of the display device of FIG. 2B.

FIG. 1 is a plan view of a display device in accordance with the present disclosure. FIG. 2A is a plan view of a display device in accordance with first embodiment of the present disclosure. FIG. 2B is a cross-sectional view of FIG. 2A, taken along line I-I'. FIG. 2C is a view illustrating principles of resonance of the capping stack. FIG. 3 is a graph illustrating transmittances according to wavelength when capping layer structures of the first to third experimental examples are applied in the transmission portion of the display device of FIG. 2B. FIG. 4 is a graph illustrating EL spectrums (blue wavelength) when capping layer structures of the first to third experimental examples are applied in the transmission portion of the display device of FIG. 2B.

As shown in FIG. 1, in the display device of the present disclosure, a plurality of pixels, each including an emission portion E and a transmission portion T, are two-dimensionally repeated in horizontal and vertical lines, in an active area AA of a substrate 100. That is, in the active area AA, the plurality of pixels are provided at rows and columns, thus a plurality of emission portions E and a plurality of transmission portions T are provided in the substrate 100.

Each pixel may have one emission portion E and one transmission portion T, or as shown in FIG. 1, each pixel may have a first to third color emission portions E1, E2, and E3 emitting different color lights, and one transmission portion T. The combined first, second and third color emission portions E1, E2 and E3 in each pixel may emit a white light.

The emission portions E (E1, E2, and E3) and the transmission portion T may be parallel each other at different rows as shown in FIGS. 1 and 2A or may be parallel at different columns. The emission portions E (E1, E2 and E3) and transmission portion T may have rectangular shape, for an example, like FIGS. 1 and 2B. But it is not limited thereto. The emission portions E (E1, E2 and E3) and transmission portion T may have polygon or oval, different from a rectangular shape. Or at least one of the emission portions E (E1, E2 and E3) and transmission portion T may have at least one corner having a rounded shape. In some cases, edges of the emission portions E (E1, E2, E3) and the transmission portion T may be spaced at regular intervals.

Also, the emission portions E (E1, E2, and E3) and the transmission portion T may have different shapes. Size of emission portions E1, E2, and E3 emitting different color lights may be different. If the display device has a specific color directivity, the size of the specific color emission portion (of the specific color) may be larger than those of the other emission portions.

Further, the transmission portion T may be greater than each of the first to third color emission portions E1, E2 and E3, in order to increase transmittance of the display device.

A bank 150 may be provided among the emission portions E (e.g., E1, E2, E3) and the transmission portion T to define their areas. The bank 150 may be overlapped with at least one edge of a reflective electrode structure 111.

Also, each of the emission portions E (E1, E2, E3) has an light emitting element including opposing electrodes and a light emitting layer interposed therebetween (referring an OLED in FIG. 2B). On the contrary, the transmission portion T may not have the light emitting element OLED. The transmission portion T may have at least one layer of the light emitting element OLED excluding the light emitting layer.

The display device has a feature in a structure of a capping stack 170. The capping stack 170 is for protecting the light emitting element and improving the light emission effect toward an upper portion. In particular, the capping stack 170 is characterized in that it includes the first capping structure C1 on at least a part of the transmission portion. The first capping structure C1 has a first optical distance. Also, the first capping structure C1 has a transmittance of destructive interference properties.

The display device further has a second capping structure C2 on at least a part of the emission portion E. The second capping structure C2 has different optical characteristics from the first capping structure C1. That is, the second capping structure C2 has a different optical distance from that of the first capping structure C1. The second capping structure C2 has constructive interference properties. In the display device, the first and second capping structures C1 and C2 have different vertical structures. In the display device of the present disclosure, the first and second capping structures C1 and C2 are together applied within the capping stack 170, transmittance of the transmission portion T and light efficiency of emission portion E are increased.

Various configuration of the capping stack 170 according to embodiments will be described later.

The substrate 100 is formed of a transparent material sufficient to transmit light through the rear surface thereof, for example, a glass substrate or a transparent plastic film. Although, if the transparent display device requires flexibility permanently or in use, the substrate 100 is formed of a transparent plastic film, a glass substrate having a small thickness may be employed as the substrate 100.

An arrangement of the first to third emission portions E1, E2, E3 provided in the emission portion E may include, for example, in order of blue, green and red emission portions, without being limited thereto, the order of color may be changed. The emission portion E, may further include a white emission portion. Or arrangement of the blue, green and red emission portions may be replaced with another arrangement including, for example, cyan, magenta and yellow emission portions, or yet another arrangement including a combination of other colored emission portions is possible. Light emitting diodes in the emission portion E may be organic light emitting diodes or inorganic light emitting diodes according to components of the light emitting layers.

Although cases in which organic light emitting diodes are used will be mainly described below, the emission portion E may include, for example, quantum dot light emitting diodes (QLEDs) by replacing organic light emitting layers with layers including quantum dot light emitting layers.

Hereinafter, the display device of the present disclosure will be described in detail according to embodiments.

First Embodiment

As shown in FIGS. 1 to 2C, the display device according to the first embodiment of the present disclosure comprises a plurality of emission portions E (E1, E2, E3) and a plurality of transmission portions T on a substrate 100, a light emitting layer 132a, 132b, 132c provided in each of the emission portions E1, E2, E3, a light emitting element OLED having a structure of transmissive electrode 140 and a reflective electrode structure 111 interposing the light emitting layer 132a, 132b, 132c therebetween, a passing electrode 140a in each of the transmission portions T, the passing electrode 140a extended from a structure of the transmissive electrode 140 and the capping stack 170 on a structure of the transmissive electrode 140 and the passing electrode 140a.

The structure of the transmissive electrode 140 and the passing electrode 140a may be integrally provided without any disconnection or any separation in the active area AA. The transmissive electrode 140 and the passing electrode 140a may be a transparent electrode or transflective metal. In each of the emission portions E1, E2 and E3, a light is generated in the light emitting element OLED, and the light from the light emitting element OLED may be directly emitted through the structure of the transmissive electrode 140 to outside. Also, after repetitive resonance between the reflective electrode structure 111, the light from the light emitting element OLED, the light from the light emitting element OLED may be transmitted to outside in a specific wavelength range with an improved or strong cavity.

If the structure of the transmissive electrode 140 is a transparent electrode, the structure of transmissive electrode 140 may include a transparent oxide electrode such as at least one of ITO (Indium Tin Oxide), IZO (Indium Zinc Oxide) or ITZO (Indium Tin Zinc Oxide). If the structure of the transmissive electrode 140 includes a transflective electrode, the structure of the transmissive electrode 140 may be formed of a silver (Ag) alloy, such as AgMg, or other trans-reflective metal alloy to have both reflection and transmission properties. If the structure of the transmissive electrode 140 includes the transflective electrode, since the structure of the transmissive electrode 140 and the passing electrode 140a are integrally formed, for transparency of the transmission portion, the structure of transmissive electrode 140 may have a thickness of about 50 Å to 250Å. In some case, the structure of the transmissive electrode 140 has a thinner thickness in the transmission portion T than in the emission portion E for transparency in the transmission portion T.

The structure of the transmissive electrode 140 may further include a transition metal layer for preventing agglomeration of internal alloy components and stability to an external environment such as ultraviolet rays or heat. The transition metal layer may be disposed under or on the structure of the transmissive electrode 140 (of transparent electrode or transflective electrode). The transition metal layer is provided with a thinner thickness than the structure of the transmissive electrode 140 (of transparent electrode or transflective electrode) so as not to affect a performance of the light emitting element OLED.

Light generated by the light emitting element OLED is transmitted to the outside through the structure of the transmissive electrode 140. In order to improve a light emission effect, the capping stack 170 is provided on the structure of the transmissive electrode 140. The capping stack 170 comprises a first capping structure C1 of first capping layer 171 having destructive interferences properties as a single layer over at least part of the transmission portions T, and a second capping structure C2 of the first capping layer 171 and a second capping layer 172 as a double layers having constructive interferences properties over at least part of the emission portions E. The first capping structure C1 and the second capping structure C2 have different optical distances having different interference properties.

The first capping layer 171 has the optical distance having destructive interference properties by a condition equation "$2n_1 d_1 \cos\theta = m_1 \lambda$" ($n_1$ being a refractive index of the first capping layer, $d_1$ being a thickness of the first capping layer, $m_1$ being an integral, $\lambda$ being a destructively interfered wavelength and $\theta$ being an angle of incidence). The first capping layer 171 exhibits destructive interference in a range of wavelength of about 400 nm to 600 nm which mainly includes a blue wavelength. That is, the first capping structure C1 which singly has the first capping layer 171, has destructive interference to a light which mainly includes a blue wavelength. In the transmission portion T, a light round tripped within the first capping layer 171 and passing light through the passing electrode 140a from the light emitting element OLED are destructed at a bottom surface of the first capping layer 171, and thus amount of light transmitted through the passing electrode 140a with a transparent light entering a rear surface of the substrate 100 may be increased. This is because each of reflection waves of both interfaces of the first capping layer 171 constituting the first capping structure C1 has opposite phases, thereby being destructively interference. In this case, most amount of light transmitted from the rear surface of the substrate 100 to an upper portion is incoherent with the phase of the reflection waves of the first capping layer 171, and so the most amount of light transmitted from the rear surface of the substrate 100 is emitted at the upper portion of the first capping structure C1 in the transmission portion T without reflections at interfaces of the first capping layer 171. In some embodiments, destructive interference occurs when the maxima of two waves are 180° out of phase, for example, a positive displacement of one wave is cancelled exactly by a negative displacement of the other wave, and the amplitude of the resulting wave is zero.

And the second capping structure layer 172 has an optical distance having constructive interference properties by a condition equation "2nd cos θ=(m$_2$+½)λ" (n being a refractive index of the first, second capping layers, d being a total thickness of the first and second capping layers, m$_2$ being an integral, λ being a wavelength and θ being an angle of incidence). The second capping structure C2 is formed with stacking the first capping layer 171 and the second capping layer 172. In some embodiments, constructive interference occurs when the maxima/minima of two waves add together (the two waves are in phase), so that the amplitude of the resulting wave is equal to the sum of the individual amplitudes.

Meanwhile, in the display device of the present disclosure, required wavelength λ to define optical distances 'nd' of the first and second capping structures C1 and C2 may be determined by the blue wavelength which is the most sensitive in the display device.

The first and second capping layers 171 and 172 may be made of the same material, thus the first and second capping layers 171 and 172 may have the same refractive index. However, it is note limited, and the first and second capping layers 171 and 172 are made of different materials, therefore, they have difference between refractive indices. Even if the first and second capping layers 171 and 172 have different refractive indices, difference of refractive indices between the first and second capping layers 171 and 172 is small, and in the second capping structure C2, there is almost no interfacial reflection between the first and second capping layers 171 and 172. Reflecting the bottom surface of the first capping layer 171 from which light enters and reflecting an upper surface of the second capping layer 172, affect the emission of light passing through the structure of transmissive electrode 140. There is the light emitting element OLED in the emission portion E. So the light resonated between the reflective structure 111 and the structure of the transmissive electrode 140 of the light emitting element OLED and then emitted through the structure of the transmissive electrode 140. Reflections at upper and lower interfaces (reflection at a lower surface of the first capping layer 171 and a upper surface of the second capping layer 172) of the second capping structure C2 have constructive interference with light from the light emitting element OLED. So, for an example, each of a blue light, a red light and a green light from each of the light emitting layers 132a, 132b, 132c in each of the light emitting element OLED is emitted to have an improved or strong cavity in a specific wavelength, respectively.

In this way, the first capping structure C1 is formed of a single layer of the first capping layer 171 having the destructive interference properties, and the second capping structure C2 is formed of stacked first and second capping layers 171 and 172 for different an optical distance from the first capping structure C1. For different optical distances (n$_1$d$_1$ and n$_2$d$_2$) in the first and second capping layers 171 and 172, the second capping layer 172 may have a different material from material of the first capping layer 171 or may have a different thickness from the thickness of the first capping layer 171. The second capping structure C2 has constructive interference properties by further having the second capping layer 172 on the first capping layer 171.

The first capping layer 171 is continuous over the emission portions E and transmission portions T. Also, the first capping layer 171 may be provided where the bank 150 among the emission portions E and the transmission portions T exist. In this case, the first capping layer 171 may be formed by using a common mask which is opened to an entirety of the active area AA. The common mask forming the first capping layer 171 may be the same common mask as any one of common masks forming the common layers 131, 131 and 134 or the structure of the transmission electrode 140 included in the light emitting element OLED. In consideration of a process margin, the first capping layer 171 may have a larger area than the entirety of active area AA.

On the contrary, the second capping layer 172 is selectively formed on the first capping layer 171 at a certain area. At least a portion of the transmission portion T singly has a first capping layer 171 of the first capping structure C1 without the second capping layer 172. So according to the destructive interference properties, an internal light from the light emitting element OLED is reflected and then destructed at both surfaces of the first capping layer 171 and an external light entered through the substrate 100 is transmitted through the capping structure C1 with high transmittance.

In this case, a deposition mask forming the second capping layer 172 has a shielding part for the first capping structure C1 and an opening part for the second capping structure C2.

The first and second capping structures C1 and C2 have different interference properties, are positioned at different areas, respectively. Their positions of the first and second capping structures C1 and C2 are determined by providing of the second capping layer 172. The second capping structure C2 has a high level than the first capping structure C1 due to further providing the second capping layer 172.

As shown in FIG. 1, the emission portions E (E1, E2, and E3) and the transmission portions T may be parallel each other at different rows, and each of the emission portion E includes the first to third color emission portions E1, E2 and E3 at the same row. For an example, the first to third color emission portions E1, E2 and E3 may be a blue emission portion, a red emission portion and a green emission portion, respectively, but are not limited thereto. In some cases, the emission portions E and the transmission portions T may be arranged in a column direction, and be parallel each other at different columns.

The second capping structure C2 of the capping stack 170 may be longitudinally extended along a length direction of the transmission portion T shown in FIG. 1 and may be formed even in a region in which the bank 150 is located between adjacent transmission portions T. Or a width of the second capping structure C2 may be widen to overlap with at least one part of the emission portions E (E1, E2, E3).

In any case, the capping stack 170 includes the first capping structure C1 in at least a portion of the transmission portions T and the second capping structure C2 in at least a portion of the emission portions E (E1, E2 and E3). Accordingly, the capping stack 170 may increase transmittance by the first capping structure C1 in the transmission portions T, and increase an efficiency of a device by the second capping structure C2 in the emission portions E (E1, E2 and E3).

Also, in the display device in accordance with the present disclosure, the first capping layer 171 having destructive interference properties is in contact with an upper part of the structure of the transmissive electrode 140, and has a first refractive index n$_1$ of 1.8 or more. Since the first capping layer 171 has high refractive index, when an encapsulation stack or an air gap is provided on the capping stack 170, the first refractive index of the first capping layer 171 is higher than a refractive index of a lowermost inorganic encapsulation layer by 0.2 or more and there will be an interfacial reflection at the upper and lower surfaces of the first capping layer 171. So, among a light having resonance effect inside the first capping layer 171 and a light passing through the passing electrode 140a, an internal light due to the light emitting element OLED is destructed and transmittance of the external light in the first capping structure C1 may be improved. Difference in refractive index between the first capping layer 171 and the lowermost inorganic encapsulation layer of the encapsulation stack or the air gap is preferably 0.2 or more. More preferably, the interfacial reflection may be increased by making the difference in refractive index 0.3 or more between the first capping layer 171 and the lowermost inorganic encapsulation layer of the encapsulation stack.

Herein, the first refractive index $n_1$ of the first capping layer 171 may be 1.8 to 2.7, and the second refractive index $n_2$ of the second capping layer 172 may be same to the first refractive index or may have a difference of less than 0.2. As long as the first and second capping layers 171 and 172 have the aforementioned refractive indices and interference properties, the first and second capping layers 171 and 172 may be any of organic, inorganic and organic/inorganic hybrid materials.

Of the configuration of the light emitting element OLED, the reflective electrode structure 111 and the light emitting layers 132a, 132b, 132c are provided only in the emission portions E1, E2, and E3, the structure of the transmissive electrode 140 and the common layers 131, 133 and 134 are in common in the emission portions E1, E2, and E3, and the transmission portion T. A structure of the light emitting element OLED except for electrodes (the reflective electrode structure 111 and the structure of the transmissive electrode 140) is referred to an organic stack EL, and the common layers 131, 133 and 134 excluding the light emitting layers 132a, 132b and 132c are formed together on the transmission portion T.

In case that the light emitting elements OLEDs are provided in the emission portions E (E1, E2 and E3), the light emitting element OLED includes the light emitting layer 132a, 132b or 132c and the reflective electrode structure 111 between a first surface (a lower surface of the light emitting layer 132a, 132b or 132c) of the light emitting layer 132a, 132b or 132c and the substrate 100. Also, commonly over a plurality of pixels in the active area AA, the structure of transmissive electrode 140 is provided on a second surface (an upper surface of the light emitting layer 132a, 132b or 132c) of the light emitting layer 132a, 132b or 132c. A plurality of reflective electrode structures 111 are provided in the color emission portions E1, E2 and E3, respectively, and spaced each other.

The first common layer 131 may have a hole injection property and/or hole transporting property, and the second and third common layers 133 and 134 may have an electron transporting property and an electron injection property, respectively. The first common layer 131 is provided between the reflective electrode structure 111 and the light emitting layer 132a, 132b or 132c, and the second and third common layers 133 and 134 are stacked and provided between the light emitting layer 132a, 132b or 132c and the structure of the transmissive electrode 140.

In some cases, the third common layer 134 may be omitted, thus the second common layer 133 may be singly provided between the light emitting layer 132a, 132b or 132c and the structure of the transmissive electrode 140. Each of the first to third common layers 131, 133 and 134 may be provided as a single layer or a plurality of layers.

In some cases, a transparent electrode may be further provided above and/or below the reflective electrode.

The display device of the present disclosure selectively includes the reflective electrode structure 111 only in the emission portion E (E1, E2, E3), and the reflective electrode structure 111 reflects a light generated from the light emitting layer 132a, 132b, 132c and return it an upper part from the upper surface of the reflective electrode structure 111.

The reflective electrode structures 111 are separated into a plurality of color emission portions E1, E2 and E3 for each color, and thus sub-pixels may be defined for each color emission portions E1, E2 and E3. And at least one thin film transistor TFT1, TFT2, TFT3 is provided at each sub-pixel. The thin film transistor TFT1, TFT2, TFT3 is connected to the reflective electrode structure 111 for each sub-pixel.

The first to third common layers 131, 133 and 134 and the structure of the transmissive electrode 140 are continuous over the light emission portions E (E1, E2 and E3) and the transmission portions T, without any disconnection in the active area AA. The first common layer 131 may be a hole transport layer HTL, the second common layer 133 may be an electron transport layer ETL and the third layer 134 may be an electron injection layer EIL or an interfacial compensation layer.

Including the configuration from the reflective electrode structure 111 to the structure of the transmissive electrode 140 on the emission portion E (E1, E2, E3), it is referred as the light emitting element OLED. In particular, the light emitting layer 132a, 132b or 132c included therein is an organic light emitting layer, the configuration from the reflective electrode structure 111 to the structure of the transmissive electrode 140 on the emission portion E (E1, E2, E3) may be referred as an organic light emitting device. Experiments and characteristic comparisons described hereinafter are based on an application as the organic light-emitting device is applied in the light emitting element. However, the light emitting element of the display device of the present disclosure is not limited to the examples in which the light emitting element is applied as the organic light emitting device, the light emitting element may be a quantum dot light emitting device using a quantum dot light emitting layer.

The emission portion E (E1, E2, E3) has the thin film transistor TFT1, TFT2, TFT3 electrically connected to the reflective electrode structure 111 and each light emitting element OLED connected to the thin film transistor TFT1, TFT2, TFT3, and the light emitting element OLED which is located on the thin film transistor is selectively driven by turning the film transistor TFT1, TFT2, TFT3 on and off.

In the transmission portion T in which the rear surface of the substrate 100 may be seen, in order to secure transparency of the transmission portion T, the thin film transistors TFT1, TFT2 and TFT3, the reflective electrodes 111 and the organic light emitting layers 132a, 132b and 132c provided in the emission portion E are not provided in the transmission portion T. Here, the first to third common layers 131, 133 and 134 provided in common in the emission portion E and the transmission portion T, may be layers having transparency and form an organic stack EL. An external light from the rear surface of the substrate 100 is transmitted through the organic stack EL without being shielded due to their transparency.

In the display device in accordance with the first embodiment of the present disclosure, the structure of the transmissive electrode 140 is shared by the emission portions E and the transmission portions T. This means that a single structure of the transmissive electrode 140 to which common voltage or ground voltage is applied is formed throughout the active area including a plurality of pixels, in which an image is displayed. If the structure of the transmissive electrode 140 is selectively removed in the transmission portions T, resistance around a region of the transmission portion T from which the structure of the transmissive electrode 140 is removed is increased and thus voltage drop of the structure of the transmissive electrode 140 may occur. Therefore, the structure of the transmissive electrode 140 may be formed in common in the emission portion E and the transmission portion T. In addition, the structure of the transmissive electrode 140 can be formed by a deposition process using a common mask forming any one of the common layers 131, 133, 134 of the organic stack EL, thus it is possible to prevent an organic damage as sputtering process is applied. Also, in the display device of the present disclosure having the structure of the transmissive electrode 140, the equipment can be unified, thereby yield can be increases and processes will be simplified. In addition, it is difficult to apply a metal mask including a shielding portion for the active area AA due to high temperature during the metal deposition process since the metal mask may be deformed due to the high temperature. Also, if a transmissive electrode is formed using the metal mask having a plurality of shielding parts for the active area, sheet resistance tends to increase in a patterned transmissive electrode and reliability of the transmissive electrode tends to decrease due to high temperature of deposition process as the thickness of the transmissive electrode becomes thinner.

In the display device of the present disclosure, the structure of the transmissive electrode 140 can be with one process without having any division in the active area AA, thus it can be formed sufficiently maintaining reflection and transmission properties. That is, the deposition mask forming the structure of the transmissive electrode 140 has one open area for the active area AA, and it can prevent reliability degradation due to equipment fluctuations or mask fluctuations. The structure of the transmissive electrode 140 can be formed with a thin thickens in one process, and also have high transmittance, low resistivity and high reliability. The display device of the present disclosure is characterized in that the configuration of the capping stack 170 is changed as described above in order to adjust light emitting efficiency of the emission side.

The structure of the transmissive electrode 140 is formed of a silver (Ag) alloy, such as AgMg, to exhibit light transmission properties of the transmission portion T and resonance properties of the emission portion E, and may thus have both reflection and transmission properties. Otherwise, the structure of the transmissive electrode 140 may be a transparent electrode formed of IZO or ITO. If the structure of the transmissive electrode 140 is formed of a metal having both of reflection and transmission properties, the thickness of the structure of the transmissive electrode 140 may be 250 Å or less, more preferably 120 Å or less so that the transmission portion T has transmittance of a designated value or more due to the characteristics of the structure of the transmissive electrode 140 disposed in common in the transmission portions T and the emission portions E.

With reference to FIGS. 3 and 4, transmittance and EL spectral characteristics in the transmission portion of the display device of the present disclosure will be described.

The inventors of the present disclosure conducted experiments by applying the first capping layer structure differentiating optical distances in the transmission portion T for the first to third experimental examples (A, B, C). The first to third experimental examples A, B and C used different materials or used different thickness for the first capping layer structure. For the first capping layer structure as a single layer, an optical distance of the destructive interference properties is applied in the first experimental example A, an optical distance of the constructive interference properties is applied in the third experimental example C and an optical distance of intermediate properties between the destructive interference and the constructive interference is applied in the second experimental example B.

Meanwhile, the transmittance described in the present specification means a value obtained by multiplying an aperture ratio of the transmission portion T according to an area ratio of the transmission portion provided in the substrate 100 and a transmittance according to the components of the transmission portion T.

FIG. 3 shows that a transmittance has about 87% or more in a visible light wavelength of 430 nm to 655 nm, in the first experimental example A of destructive interference properties. Particularly, the transmittance has 90% or more in wavelength of 430 nm to 600 nm, in the first experimental example A.

On the contrary, a transmittance in all the visible light wavelength of 430 nm to 655 nm is shown less than 90%, in the third experimental example C of constructive interference properties.

Also, a transmittance in the visible light wavelength of 430 nm to 655 nm is shown in a range of 75% to 93% in the second experimental example B of intermediate properties between the destructive interference and the constructive interference.

Referring FIG. 3, it can be seen that as in the third and second experimental examples C and B, in case of fully or partially having the constructive interference properties, the transmittance are particularly degraded in the blue wavelength.

On the contrary, as in the first experimental example A, in case of having the destructive interference, it can be seen that the transmittance of 90% or more is obtained in the wavelength range of at least 430 nm to 620 nm. This means that when the optical distance of the first capping layer 171 (of the capping stack 170) is adjusted having a destructive interference properties in the transmission portion T, improved transmittance in the visible light wavelength range can be expected.

Also, referring FIG. 4, from the third experimental examples C to the first experimental example A, it can be seen that full width at half maximum FWHM of the spectrums increases for the blue wavelength, and a shoulder is observed on a right side of relatively longer wavelength in the graph. This means that from the third experimental examples C to the first experimental example A, it loses the micro-cavity characteristics and has light transmission characteristics in a wider wavelength range. That is, as in the first experimental example A, when the first capping structure C1 is applied with the first capping layer 171 of destructive interference properties, the amount of blocking for external light passing from the rear surface of the substrate 100 is decreased and thus transmittance of the external light can be increased.

FIG. 4 shows EL spectrums for a blue wavelength having the highest sensitivity among wavelengths in the visible light range. As shown in FIG. 3, the transmittance of 90% or more can be obtained for the green wavelength (510 nm to 590 nm) and the red wavelength (605 nm to 635 nm) in the first experimental example A having the first capping layer of destructive interference properties in the transmission portion T.

That is, referring FIGS. 3 and 4, in case that the first capping structure C1 having a single configuration of the capping layer 171 having the destructive interference properties with respect to in the transmission portion T is applied to the display device of the present disclosure, it can be seen that an effect of improved transmittance and improved transparency of the external light can be obtained, when the external light transmitted from the rear surface of the substrate 100 passes through the first capping structure C1.

In the first embodiment of the present disclosure, the first capping structure C1 including the first capping layer of destructive interference properties is applied with respect to the entire area of the transmission portion T, and the second capping structure C2 is applied with respect to the other area of the transmission portion T, in particular, for the first to third color emission portions E1, E2 and E3. Even when the second capping structure C2 is applied in an island shape along the respective shapes of the first to third color emission portions E1, E2 and E3, the same optical effect as in the first embodiment of the present disclosure may be obtained.

The wavelength of the red emission may correspond to 600 nm to 650 nm, the wavelength of the blue emission may correspond to 430 nm to 460 nm and the wavelength of the green emission may correspond to 510 nm 590 nm described in the present specification.

In the display device in accordance with the present disclosure, the capping structure 170 is provided to protect the light emitting element OLED, assist extraction of light in the emission portion E and increase transmittance of the transmission portion T. For this purpose, the capping structure 170 is formed having the constructive interference properties by stacking the first and second capping layers 171 and 172. When a light from the light emitting element OLED passes through the second capping structure C2 in the emission portion E, the light form the light emitting element OLED is transmitted with maintaining the strong cavity properties. And in the transmission portion T, the first capping structure C1 having the destructive interference properties destructs a light inside of the display device and an internal resonance in the first capping structure C1, thereby reducing or minimizing a loss of the external light coming from the lower part of the substrate 100 and so the external light is transmitted as it as.

Although the bank is omitted by focusing on the internal configuration is illustrated in FIG. 2B, but the tank 150 may be provided among the transmission portions T and among the color emission portions E1, E2 and E3, and between the transmission portions T and the color emission portions E1, E2 and E3, such as FIG. 2A.

The first experimental example A described above has the same structure as the first embodiment of the present disclosure.

Hereinafter, various selective applications of the first and second capping structures of the display device of the present disclosure will be described and improved efficiencies of the device will be reviewed in accordance with various selective applications of the first and second capping structures.

Figure 5A:
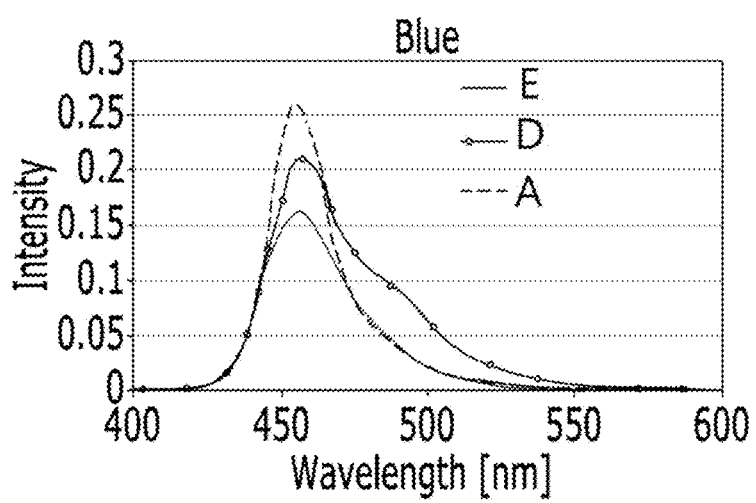
FIGS. 5A to 5C are graphs illustrating EL spectrums of blue, green and red when capping layer structures of the first, fourth and fifth experimental examples are applied in the emission portion of the display device of FIG. 2B.
Figure 5B:
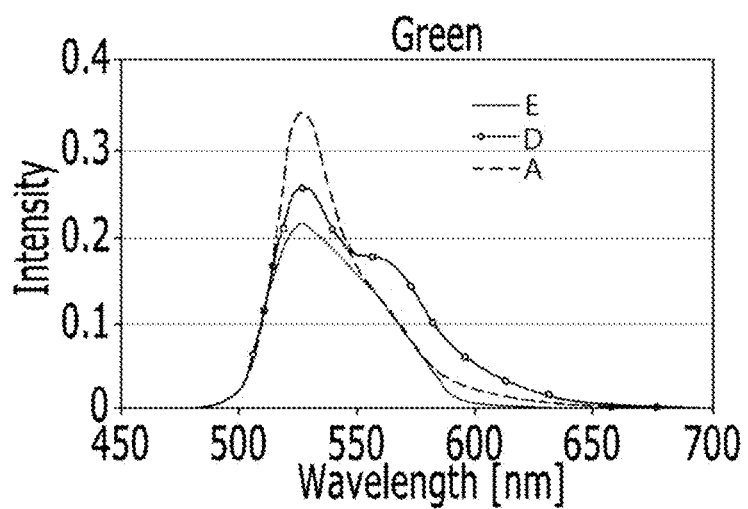
Figure 5C:
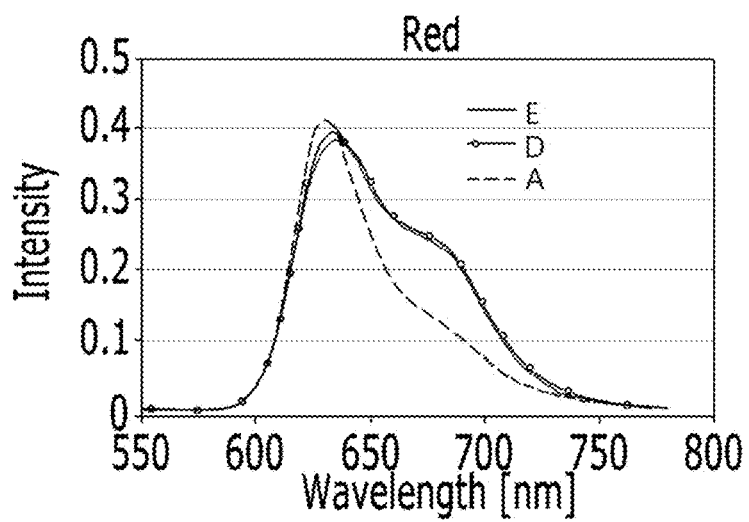
Figure 5D:
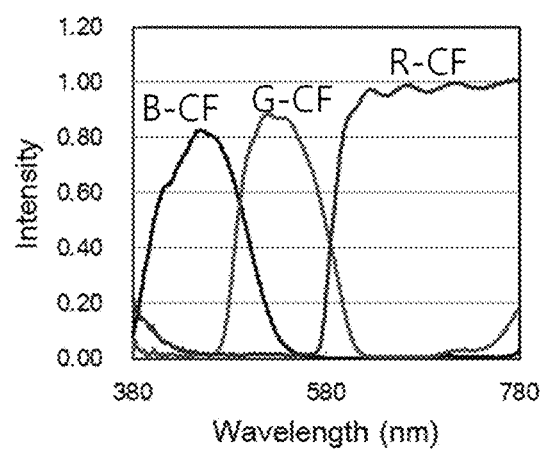
FIG. 5D is a graph illustrating transmittance properties of blue, green and red color filters.

FIGS. 5A to 5C are graphs illustrating EL spectrums of blue, green and red when capping layer structures of the first, fourth and fifth experimental examples are applied in the emission portion of the display device of FIG. 2B. And FIG. 5D is a graph illustrating transmittance properties of blue, green and red color filters.

The inventors of the present disclosure conducted experiments for the first experimental example A, a fourth experiment example D and a fifth experimental example E. The first experimental example A and the fourth experimental example E are to have different optical distances by having the second capping structure C2 of the capping stack 170 in the emission portion E, and respectively. In the fifth experimental example E, color filters B, G, R according to wavelengths of the color emission portions BE, GE and RE are further applied on the second capping structure C2 of the fourth experimental example D. The first experimental example A has the capping stack 170 by stacking the first and second capping layers 171 and 172 to have constructive interference properties in the emission portion as shown in FIGS. 2A to 2C. On the contrary, the fourth experimental example D and the fifth experimental example E have a capping structure of destructive interference properties, respectively.

Referring the FIGS. 5A to 5D and a Table 1, EL emittance spectrums and efficiencies of the first, fourth and fifth experimental examples A, D and E are examined.

TABLE 1

| | Color Emission portion | Driving Voltage (V) | Efficiency (Cd/A) | CIEx | CIEy | Color gamut (DCI)(%) | White Efficiency (Cd/A) |
|---|---|---|---|---|---|---|---|
| D (D.I) | BE | 8 | 12.4 | 0.137 | 0.102 | Area ratio 82% | 44.5 |
| | GE | 7.3 | 139.1 | 0.338 | 0.630 | Overlap Ratio 76% | |
| | RE | 7 | 27.8 | 0.695 | 0.303 | | |
| E (D.I + CF) | BE | 8 | 5.4 | 0.137 | 0.060 | Area ratio 110% | 33.8 |
| | GE | 7.3 | 101.3 | 0.277 | 0.686 | Overlap ratio 99% | |
| | RE | 7 | 25.9 | 0.699 | 0.300 | | |
| A (C.I) | BE | 7.7 | 12.1 | 0.141 | 0.062 | Area ratio 105% | 54.2 |
| | GE | 6.8 | 219.4 | 0.278 | 0.683 | Overlap ratio 98% | |
| | RE | 6.6 | 45.1 | 0.693 | 0.305 | | |

In the Table 1, 'DCI (Digital Cinema Initiatives)' described in the color gamut, refers to a degree of satisfaction of the color gamut that can be expressed in an application of the digital cinema. In comparison, BT2020 is a standard of 4K/UHD recommended by the ITU of an international broadcasting standards organization, and BT709 is a standard of HD support color gamut. Going to BT709, DCI, BT2020, more stringent standards are applied, and the color expression area is larger.

Increasing the respective values in an area ratio of DCI means that a wider variety of colors can be implemented than in large area and high-resolution displays, and it has an effect of providing clear image quality. In addition, an increase in each value in an overlapping ratio of DCI means that the area overlapped with the standard of a color gamut is large, and it more conforms to the standard of the display.

Further, a white efficiency is the efficiency measured in color coordinates (0.313, 0.329).

As shown in FIGS. 5A to 5C, the fourth experimental example of destructive interference properties shows a shoulder in the EL spectrum or blue, green and red emission portions on the right side of the graph due to low efficiency of microcavity.

The Table 1 shows the blue, green and red color coordinates of the fourth experimental example deviate from pure blue, green and red coordinates. In particular, the CIEy of the blue coordinate has risen, thus the fourth experimental example is impossible to implement a deep blue display. And it means that it is difficult to implement a pure green and a pure red in the fourth experimental example.

Particularly, the fourth experimental example shows that an area ratio is 82% and an overlapping ratio is 76% in the standard of DCI, thus a color reproduction rate is not very satisfactory.

To compensate microcavity properties in the fourth experimental example, as shown in FIG. 5D of the fifth experimental example, the blue color filter B-CF, the green color filter G-CF and the red color filter R-CF filtering light away from the blue, green and red wavelengths are applied to a top of the capping stack of the fourth experimental example.

The fifth experimental example has the same capping stack as the fourth experimental example. Therefore, the same driving voltages are applied to light emitting elements under the capping stack of the blue, green and red emission portions BE, GE and RE as in the fourth experimental example. As shown in FIGS. 5A to 5C, by applying the color filter in the fifth experimental example, it can be seen that it is possible to remove the right shoulders of the graphs by filtering effects of the color filters, and EL spectrum of each color graph has narrower FWHM than the fourth experimental example. As shown in the Table 1, the fifth experimental example has the CIE characteristic similar to the pure color CIE characteristics and satisfies the area ratio and the overlapping ratio of the DCI standard. However, the fifth experimental example E does not properly uses amount of light due to filtering effects of the color filters, thus has less efficiency and less luminance of 33.8 Cd/A with a combined white spectrum of red, green and blue than 44.5 Cd/A of the fourth experimental example D.

On the contrary, as shown in FIGS. 2A to 2C, if the capping stack 170 has the second capping structure C2 of constructive interference properties to each color emission portion, the display device of the present disclosure has a narrow FWHM similar to as shown in the fifth experimental example of FIGS. 5A to 5C. This means that a pure color display is possible similarly to the structure of having color filters. Also, the display device of the present disclosure has the area ratio of 105% and the overlapping ratio of 98% of the DCI standard. It means that the present disclosure almost satisfies the DCI standard, thus has improved color reproducibility of the light emitting element in the emission portion of the display device. Also, as shown in FIGS. 5A to 5C, the display device of the present disclosure has improved intensity of blue, green and red colors than the fourth and fifth experimental examples D and E. It can be confirmed that a white luminance of the present disclosure is 54.2 Cd/A and the most efficient in Table 1. Despite its improved luminance characteristics, it can be seen that a driving voltage to drive each color emission portion is lower than the experimental example D. Such reduction in the driving voltage requires a low driving voltage when the corresponding color luminescence is driven under the same conditions and hence increasing life-span can be expected.

In the fourth experimental example D and the first experimental example A, each efficiency of the blue emission portions BE may be measures by comparing the efficiency in pure blue in consideration of not only the measured luminance value (Cd/A) but also the conversion efficiency obtained by dividing the measured luminance by the CIEy value. The conversion efficiency of the fourth experimental example D is 12.4/0.102, which is equivalent to 122, and the conversion efficiency of the first experimental example A is 12.1/0.062, which is equivalent to 195, and an increase in the blue pure efficiency of the first experimental example A can be confirmed.

That is, through the above experiments, as in the display device of the present disclosure, at least a part of the transmission portion T has the first capping structure C1 of the destructive interference properties, and at least a part of the emission portion E has the second capping structure C2 of the constructive interference properties, so that the transmittance is increased in the transmission portion T. And, it is possible to expect an effect of increasing the luminous efficiency and reducing the driving voltage, and increasing the effect of the color reproducibility in the emission portion E.

Meanwhile, the above described first to fifth experimental examples A to E have been described for a structure in which an air gap exists in the upper configuration of the capping stack. The first to fifth experimental examples A to E may use the display device according to the first embodiment of the present disclosure. For example, the first to fifth experimental examples A to E may have a space having an air gap with an encapsulation substrate (not shown) positioned above the capping stack 170. In the first to fifth experimental examples A to E, difference of refractive indices is large at the interface between the air having a low refractive index of 1.0 and the upper surface of the capping stack 170 having a relatively high refractive index (1.8 or more), so that reflection at the upper surface of the capping stack 170 may occur, and thus the internal resonance of the capping stack 170 may be used.

Hereinafter, various embodiments of arrangement of the first capping structure C1 and the second capping structure C2 of the present disclosure will be described.

The second capping structure C2 further has the second capping layer compared to the first capping structure. In the following embodiments describe various arrangement of the emission portion(s) and the transmission portion(s) and a selective arrangement relationship of the second capping structure.

Second Embodiment

Figure 6:
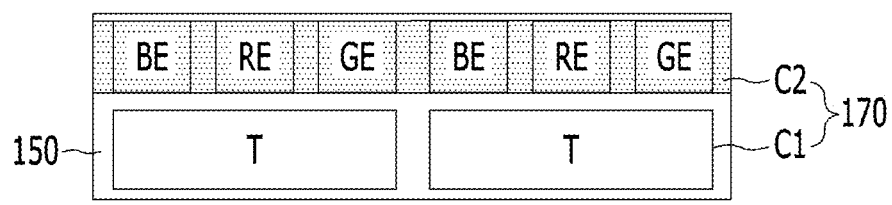
FIG. 6 is a plan view of a display device in accordance with second embodiment of the present disclosure.

FIG. 6 is a plan view of a display device in accordance with second embodiment of the present disclosure.

As shown in FIG. 6, in the capping stack 170 of the display device in accordance with second embodiment of the present disclosure, the blue, red and green emission portions BE, RE and GE emitting different color lights are arrange along a row direction, a second capping structure C2 is applied to overlap each color emission portions BE, RE and GE, and a first capping structure C1 is applied to overlap the remaining areas, including the transmission portion T.

In this case, the second capping structure C2 sufficiently overlays each color emission portions BE, RE and GE and also the bank 150 among the color emission portions BE, RE and GE continuous in the row direction. If the display device has a plurality of row of emission portions, the second capping structures C2 are applied to overlay the plurality of row of emission portions and parallel each other. A region of the capping stack 170 in which the second capping structure C2 is not provided is defined as the first capping structure C1.

As described above, the first capping structure C1 has the first capping layer 171 having the single destructive interference properties, and the second capping structure C2 having the constructive interference properties with stacking the first and second capping layers 171 and 172.

In the second embodiment, compared to the first embodiment, the second capping structure C2 is continuously arranged instead of an island shape, and the second capping layer 172 is arranged on a line so as to be parallel to the length direction of the transmission portion T. Accordingly, the open area of the deposition forming the second capping layer 172 can be long disposed to overlap the color emission portions in the row direction, so that the deposition mask has a grilled type having an open area on a line. Therefore, it is to provide the deposition mask forming the second capping layer 172. Also, since the deposition mask is not affected by left and right alignment during an alignment process, the second embodiment of the present disclosure has an advantage in the process compared to the first embodiment.

In addition, as described in the first embodiment, even in the second embodiment of the present disclosure, the transmittance is improved in the transmission portion T and each of the color efficiencies of the color emission portions BE, RE and GE is increased, and thus the color filter may be omitted. Also, in the second embodiment, there are advantages such as a reduction in the driving voltage and improvement in a color gamut. Optically, the first and second embodiments can have the same effect.

Third Embodiment

Figure 7:
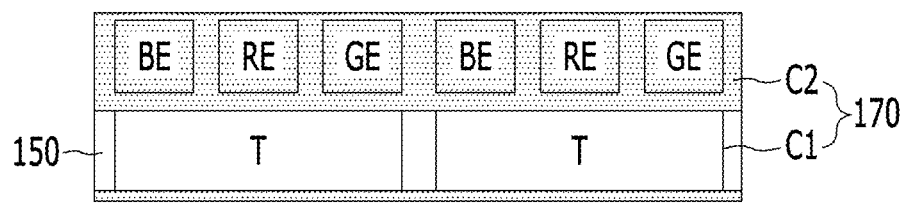
FIG. 7 is a plan view of a display device in accordance with third embodiment of the present disclosure.

FIG. 7 is a plan view of a display device in accordance with third embodiment of the present disclosure.

As shown in FIG. 7, the display device in accordance with the third embodiment of the present disclosure extends the width of the second capping structure C2 compared to that of the second embodiment, so that the second capping structure C2 may overlap with a part of the transmission portion T.

That is, in the case, the width of the second capping structure C2 may be disposed larger than 'the length in a column direction of the color emission portion(s) BE, RE and GE+the widths of the upper and lower banks of the color emission portion(s) BE, RE and GE' and overlaps with a predetermined of the transmission portion T adjacent to the color emission portion(s) BE, RE and GE. In this case, the second capping structure C2 having the constructive interference properties may be provided at a certain width of the region overlapping the second capping structure C2 in the transmission portion T. By partially providing the second capping structure C2 in the transmission portion T, it is possible to supplement and improve the transmittance of a long wavelength range as compared with the first and second embodiments.

Herein, the area of the transmission portion T to which the second capping structure C2 is applied is set to a level of 50% or less of the total area of the transmission portion T, thereby improving the transmittance obtained from the remaining first capping structure C1. That is, the first capping structure C1 corresponds to an area of at least 50% or more to the transmission portion T, thereby marking the transmittance of the entire wavelength at a level of 90% or more.

Fourth Embodiment

Figure 8A:
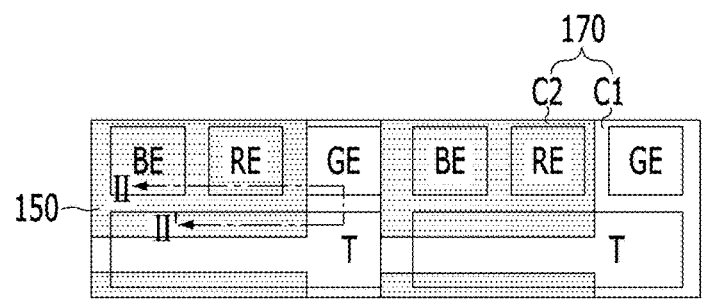
FIGS. 8A and 8B are a plan view and a cross-sectional view illustrating a display device in accordance with a fourth embodiment of the present disclosure.
Figure 8B:
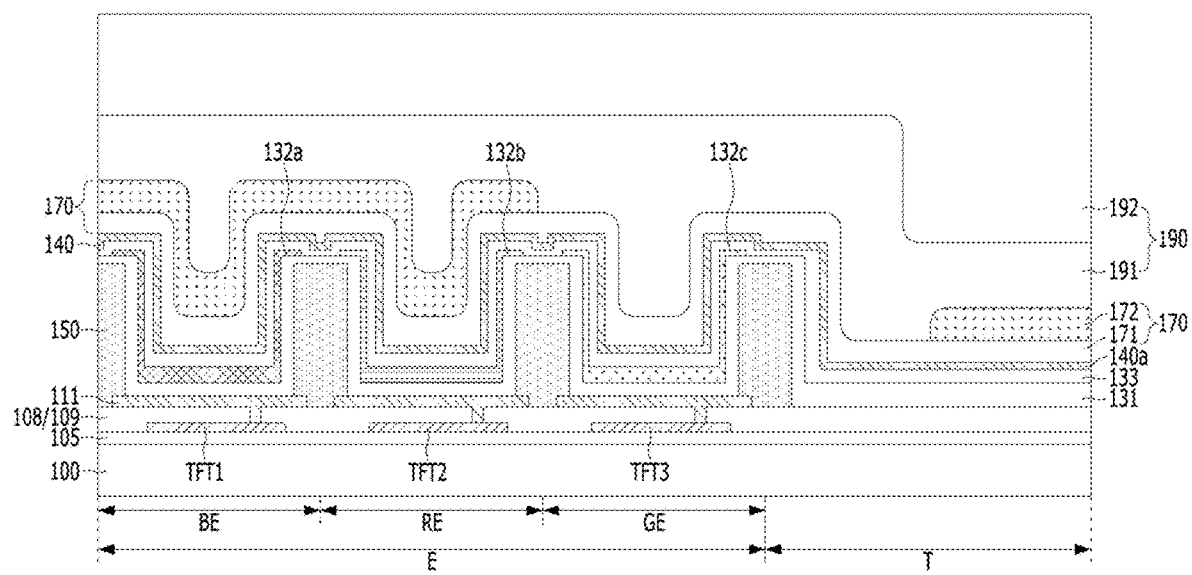
Figure 8C:
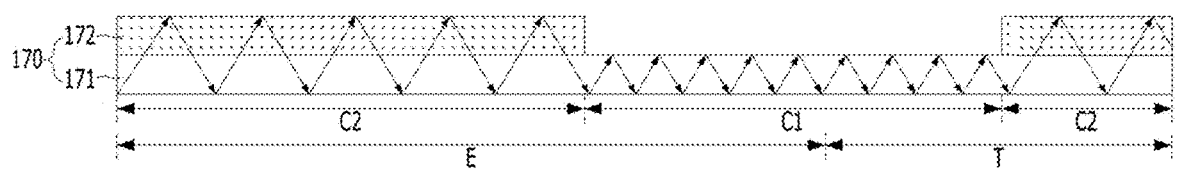
FIG. 8C is a cross-sectional view illustrating an interfacial reflection of light in a capping stack of a display device of the fourth embodiment of the present disclosure.

FIGS. 8A and 8B are a plan view and a cross-sectional view illustrating a display device in accordance with a fourth embodiment of the present disclosure. FIG. 8C is a cross-sectional view illustrating an interfacial reflection of light in a capping stack of a display device of the fourth embodiment of the present disclosure.

As shown in FIGS. 8A to 8C, in the display device in accordance with a fourth embodiment of the present disclosure, the capping stack 170 includes a second capping structure C2 in the blue and red emission portions BE and RE and a part of the transmission portion T adjacent to the blue and red emission portions BE and RE, and a first capping structure C1 in the remaining areas.

In the fourth embodiment and the fifth and eleventh embodiments described below, the transmission portion T has a partial second structure C2. Thus, a cross-section vies of FIG. 8B for the fourth to eleventh embodiments is used for understanding.

As shown in FIG. 8C, the first capping structure C1 corresponds to the green emission portion GE and the remaining transmission portion T. In this case, the second capping structure C2 is formed by stacking the first and second capping layers 171 and 172, and the second capping layer is selectively provided in a region of the second capping structure C2. In this case, the second capping layer 172 may have an island-like shape, and is uniformly provided in a pixel unit consisting of a set blue, red and green emission portions and one transmission portion T.

As shown in FIGS. 8A to 8C, if the second capping structure C2 corresponds to a partial area of the transmission portion T, a long wavelength transmittance at the transmission portion T may be improved. In addition, by providing the second capping structure C2 to overlap the blue emission portion BE and the red emission portion RE with emitting materials of high sensitivity and low efficiency, in the color emission portions BE and RE which the second capping structure C2 is applied to, a color efficiency, a color gamut (color reproducibility) and a device characteristics may be improved.

In FIG. 8B, the bank 150 is shown among each color portions BE, RE and GE and between the color portions BE, RE and GE and the transmission portion T. The bank 150 may define areas of each color emission portions BE, RE and GE before forming the organic stack EL of the light emitting elements OLED. The bank 150 may be provided to overlap at least one edge of the reflective electrode structure 111. The reflective electrode structure 111 functions as an anode. The organic stack EL may be deposited on the bank 150, also the organic stack EL may be deposited relatively thinly on a side surface of the bank 150 rather than on a flat surface of the bank 150. Alternatively, the organic stack EL may be partially separated from other on the side surface of the bank 150. As shown in FIG. 8B, the bank 150 may have a vertical side, or may have a positive taper to have an acute angle with respect to the upper surface of the reflective electrode structure 111.

In the display device of the present disclosure, the structure of the transmissive electrode 140 is shared by the emission portions E and the transmission portions T. This means that a single structure of the transmissive electrode 140 to which common voltage or ground voltage is applied is formed throughout the active area including a plurality of pixels, in which an image is displayed. If the structure of the transmissive electrode 140 is selectively removed in the transmission portions T, resistance around a region of the transmission portion T is increased and thus voltage drop of the structure of the transmissive electrode 140 may occur. Therefore, the structure of the transmissive electrode 140 may be formed in common in the emission portion E and the transmission portion T. In addition, the structure of the transmissive electrode 140 can be formed by a deposition process using a common mask forming any one of the common layers 131, 133, 134 of the organic stack EL, thus it is possible to prevent an organic damage as sputtering process for a metal layer is applied. Also, in the display device of the present disclosure having the structure of the transmissive electrode 140, the equipment can be unified, thereby yield can be increases and processes will be simplified. Meanwhile, it is difficult to apply a metal mask including a shielding portion for the active area AA due to high temperature during the metal deposition process since the metal mask may be deformed due to the high temperature. Also, if a transmissive electrode is formed using the metal mask having a plurality of shielding parts for the active area, sheet resistance tends to increase in a patterned transmissive electrode and reliability of the transmissive electrode tends to decrease due to high temperature of deposition process as the thickness of the transmissive electrode becomes thinner.

However, in the display device of the present disclosure, even in the structure of transmissive electrode 140 that is thinly formed to maintain the reflective transmittance, the structure of transmissive electrode 140 at the entire active area AA can be formed in a unified process with a deposition mask to one open area to the entire active area AA without separating areas, thereby it is possible to prevent a decrease in reliability due to equipment fluctuations or mask fluctuations. Also, the display device of the present disclosure may obtain a high transmittance, a low resistance and high reliability. For this, the device of the present disclosure is characterized in the configuration of the capping stack 170 is changed as described above in order to adjust emission efficiency of the emission side.

The structure of the transmissive electrode 140 of the present disclosure may be formed of a silver (Ag) alloy such as AgMg, as a transflective electrode, or other trans-reflective metal alloy to have both reflection and transmission properties. Alternatively, the structure of the transmissive electrode 140 may be formed of a transparent electrode such as IZO or ITO. If the structure of the transmissive electrode 140 includes the transflective electrode, the structure of transmissive electrode 140 may have a thickness of about 50 Å to 250Å for a high transmittance.

Fifth Embodiment

Figure 9:
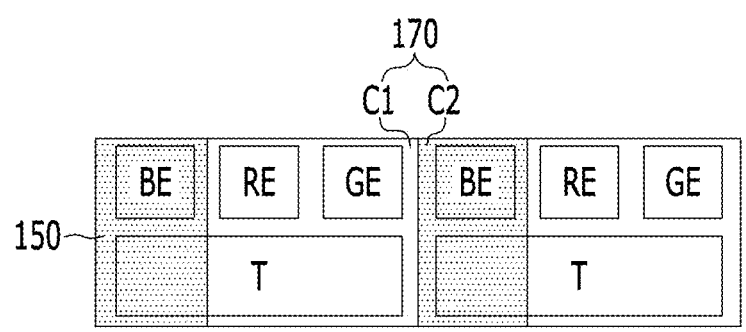
FIG. 9 is a plan view of display device of the fifth embodiment of the present disclosure.

FIG. 9 is a plan view of display device of the fifth embodiment of the present disclosure.

As shown in FIG. 9, in the display device of the fifth embodiment of the present disclosure, the capping stack 170 has the second capping structure C2 that crosses the length direction of the transmission portion T and the first capping structure C1 in the remaining area. In this case, the second capping structure C2 is longitudinally provided along a column direction. Since among red, green and blue emitting materials, the blue emitting material has the lowest efficiency so far, and amount of visual recognition by the user is small, improvement of the light emitting efficiency of blue among the various light emitting colors is most required. In this respect, the fifth embodiment of the present disclosure applies the second capping structure C2 having the constructive interference properties so as to overlap only the blue emission portions BE.

Even in the fifth embodiment, the second capping structure C2 is applied on a part of the transmission portion T to improve transmittance in a long wavelength range. Also, the second capping structure C2 is corresponded to overlap the blue emission portions BE having the light emitting material of high sensitivity and low efficiency, so that the color efficiency and the color gamut (color reproducibility) of the blue emission portions BE which the second capping structure C2 is corresponded may be improved.

Sixth Embodiment

Figure 10:
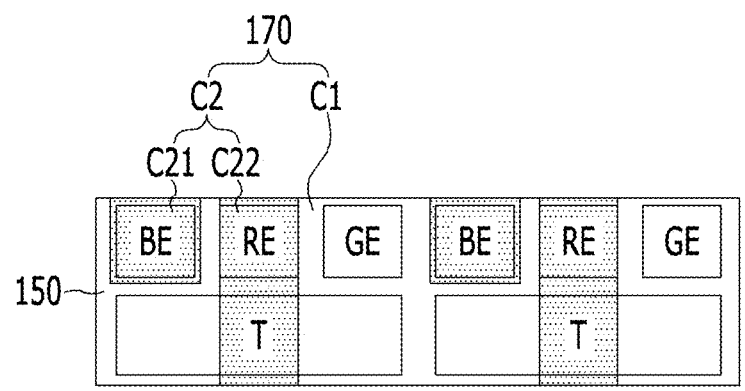
FIG. 10 is a plan view of display device of the sixth embodiment of the present disclosure.

FIG. 10 is a plan view of display device of the sixth embodiment of the present disclosure.

As shown in FIG. 10, in the display device of the sixth embodiment of the present disclosure, the capping stack 170 includes the second capping structure C2 in the blue emission portion BE, red emission portion RE and a part of the transmission portion T adjacent to the red emission portion RE. The second capping structure C2 having the constructive interference properties, includes an island shape part C21 to the blue emission portion BE, and a part in a line crossing the length direction of the transmission portion C22 overlapping the red emission portion RE and a part of the transmission portion T. The capping stack 170 also includes a first capping structure C1 in the remaining areas except for the second capping structure C2.

Even in the sixth embodiment, the second capping structure C2 is applied on a part of the transmission portion T to improve transmittance in a long wavelength range. Also, the second capping structure C2 is corresponded to overlap the blue emission portions BE and red emission portions RE having the light emitting materials of high sensitivities and low efficiencies, so that the color efficiencies and the color gamut (color reproducibility) of the blue emission portions BE and the red emission portions RE which the second capping structure C2 are corresponded may be improved.

Seventh Embodiment

Figure 11:
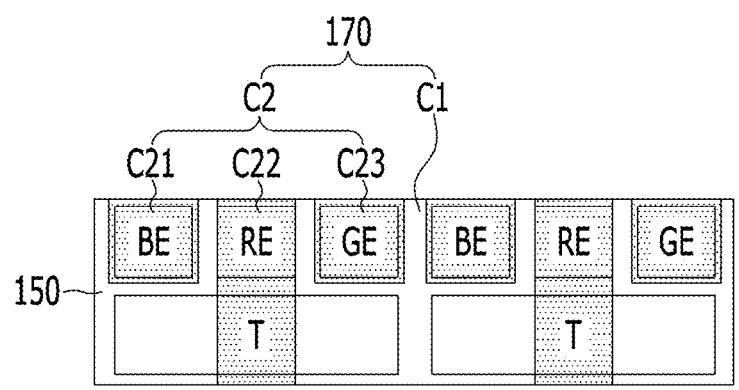
FIG. 11 is a plan view of display device of the seventh embodiment of the present disclosure.

FIG. 11 is a plan view of display device of the seventh embodiment of the present disclosure.

As shown in FIG. 11, in the display device of the seventh embodiment of the present disclosure, the capping stack 170 includes the second capping structure C2 in the blue, green emission portion BE and GE, and red emission portion RE and a part of the transmission portion T adjacent to the red emission portion RE. The second capping structure C2 having the constructive interference properties, includes island shape parts C21 and C23 to the blue and green emission portions BE and GE, and a part in a line crossing the length direction of the transmission portion C22 overlapping the red emission portion RE and a part of the transmission portion T. The capping stack 170 also includes a first capping structure C1 in the remaining areas except for the second capping structure C2.

Even in the sixth embodiment, the second capping structure C2 is applied on a part of the transmission portion T to improve transmittance in a long wavelength range. Also, the second capping structure C2 is corresponded to overlap the blue, green and red emission portions BE, GE and RE, so that the color efficiencies, the color gamut of respective color light and the device characteristics may be improved.

Eight Embodiment

Figure 12:
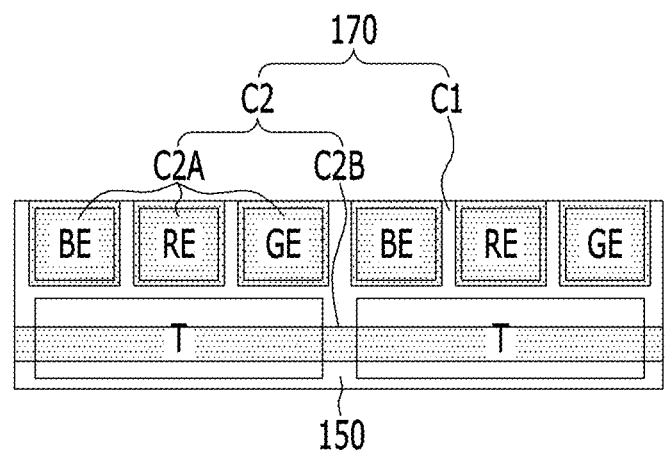
FIG. 12 is a plan view of display device of the eighth embodiment of the present disclosure.

FIG. 12 is a plan view of display device of the eighth embodiment of the present disclosure.

As shown in FIG. 12, in the display device of the seventh embodiment of the present disclosure, the capping stack 170 further corresponds to the second capping structure C2B so as to partially overlap the transmission portion T along the length direction of the transmission portion T, compared to the first embodiment. That is, the second capping structure C2 includes island-shaped parts C2A in the blue, red and green emission portions BE, GE and RE, and line-shaped parts C2B partially overlapping the transmission portion T, along the length direction (in a row direction) of the transmission portion T. The second capping structure C2 has the constructive interference properties. The capping stack 170 also includes a first capping structure C1 in the remaining areas except for the second capping structure C2.

Since the second capping structure C2B is applied on a part of the transmission portion T, it is possible to improve transmittance in a long wavelength range.

Ninth Embodiment

Figure 13:
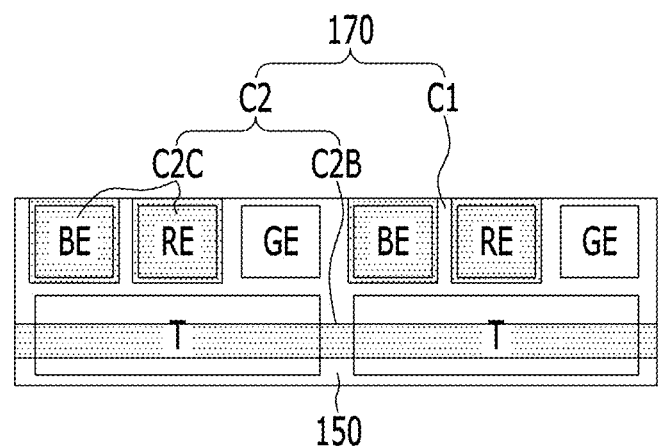
FIG. 13 is a plan view of display device of the ninth embodiment of the present disclosure.

FIG. 13 is a plan view of display device of the ninth embodiment of the present disclosure.

As shown in FIG. 13, compared with the eight embodiment, an island-shaped second capping structure of the green emission portions GE is removed in the display device of the ninth embodiment of the present disclosure. That is, in the ninth embodiment of the present disclosure, the second capping stack 170 includes island-shaped parts C2C in the blue and red emission portions BE and RE, and line-shaped parts C2B partially overlapping the transmission portion T, along the length direction (in a row direction) of the transmission portion T. The second capping structure C2 has the constructive interference properties. The capping stack 170 also includes a first capping structure C1 of destructive interference properties in the remaining areas except for the second capping structure C2.

Since the second capping structure C2B is applied on a part of the transmission portion T, it is possible to improve transmittance in a long wavelength range.

Tenth Embodiment

Figure 14:
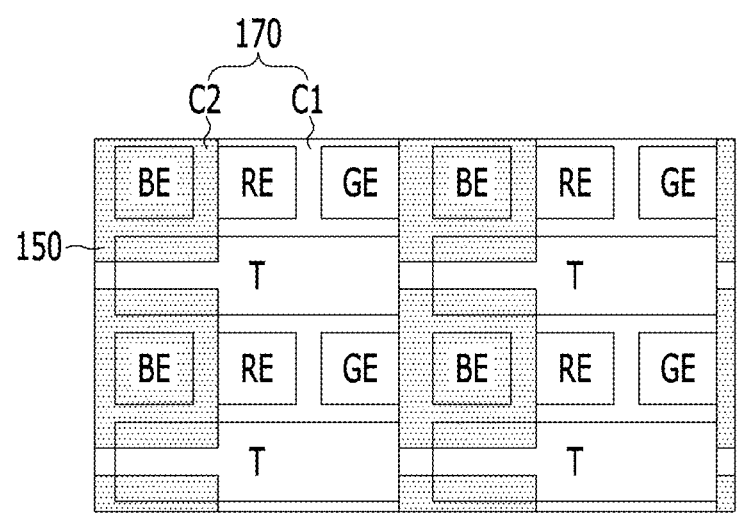
FIG. 14 is a plan view of display device of the tenth embodiment of the present disclosure.

FIG. 14 is a plan view of display device of the tenth embodiment of the present disclosure.

As shown in FIG. 14, in the display device of the tenth embodiment of the present disclosure, the capping stack 170 includes the second capping structure C2 in an island shape with respect to the blue emission portions BE and the transmission portion T at a periphery of the blue emission portion BE, and the first capping structure C1 for the remaining areas (including the green and red emission portions GE and RE and the other transmission portions T which is not overlapped with the second capping structure C2.

Since the second capping structure C2 is applied on a part of the transmission portion T, it is possible to improve transmittance in a long wavelength range.

Meanwhile, in the above-described embodiments, Figures are shown as the color emission portions E1, E2, E3 and BE, RE, GE and the transmission portions T have rectangular shapes, but are not limited thereto. That is, the color emission portions E1, E2, E3 and BE, RE, GE and the transmission portions T may have other polygons, ovals or rounded corners. Further, the color emission portions E1, E2, E3 and BE, RE, GE and the transmission portions T have the same shape or different shapes in some cases.

Hereinafter, an example of a configuration different from the shapes of the color emission portions and the transmission portion will be described.

Eleventh Embodiment

Figure 15:
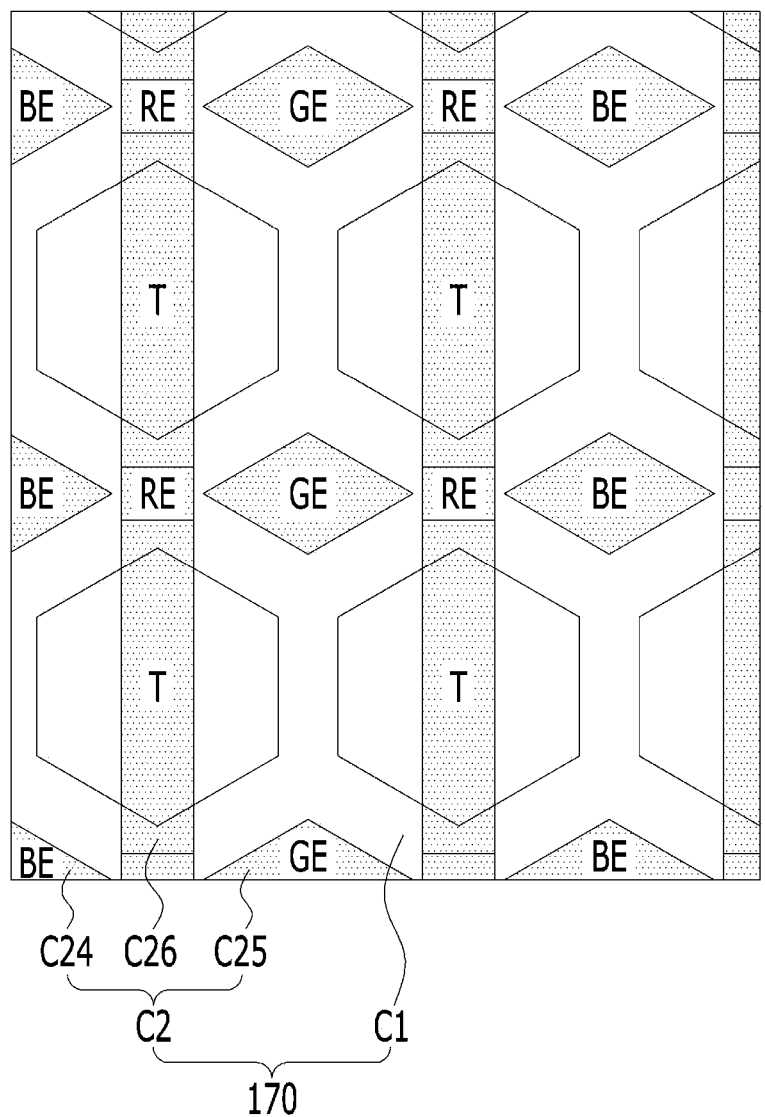
FIG. 15 is a plan view of display device of the eleventh embodiment of the present disclosure.

FIG. 15 is a plan view of display device of the eleventh embodiment of the present disclosure.

As shown in FIG. 15, in the eleventh embodiment of the present disclosure, the blue emission portion BE and the green emission portion GE have the shape in a rhombus. The red emission portion RE is disposed between the blue emission portion BE and the green emission portion GE in a rectangular shape smaller than each size of the blue and green emission portions BE and GE. The blue, red and green emission portions are repeated in a row direction, and the blue, red and green emission portions are disposed in a plurality of rows. Transmission portion(s) T may be disposed between the different rows which the color emission portions BE, RE and GE are arranged. The transmission portion T has a polygonal shape such as a hexagon, a square, an octagon or another polygon. Or the corner of the transmission portion T may be rounded. The transmission portions T may be positioned on a same column line as the red emission portions RE. Also the transmission portion T is located between the blue and green emission portions BE and GE which are diagonally arranged with respect to the transmission portions T. In the eleventh embodiment of the present disclosure, each area of the blue emission portion BE and the green emission portion GE is larger than the area of the red emission portion RE. This is why the blue emission portion BE has a relatively high sensitivity and the green emission portion BE contributes the most in controlling the white luminance of the display device among the color emission portions.

Shapes of the transmission portion T and the color emission portions BE, RE and GE are not limited thereto, and may be changed to have different polygons from shown in FIG. 15.

In the display device of the eleventh embodiment of the present disclosure, the capping stack 170 has the second capping structure C2 including a first area C24 and a second area C25 of island shapes overlapping each of the blue emission portions BE and the green emission portion GE, and a third area C26 of a line shape that crosses the length direction of the transmission portion T and overlaps the red emission portions RE, and the first capping structure C1 in the remaining area. In this case, the third area C26 is longitudinally provided along a column direction. The third area C26 fully overlaps each of the red emission portions RE and partially overlaps adjacent transmission portion T to the red emission portions RE. The third area C26 may have the same width in the red emission portion RE and the transmission portion T, thus the area C26 in the transmission portion T occupies a part of the transmission portion T. The second capping structure C2 has the constructive interference properties and the first capping structure C1 has the destructive interference properties.

The third area C26 of the second capping structure C2 may have the same width as the red emission portions having a relatively smaller width than the other color emission portions. The second capping structure C2 further comprises the second capping layer 172 than the first capping structure C1. In this case, the second capping layer 172 can be formed by a deposition mask having a line-shaped open area for the third area C26. Since the transmission portion T has the second capping structure C2 of the constructive interference properties with the same width as the red emission portion RE and the first capping structure C1 of the destructive interference properties at the remaining area, a high transmittance in the transmission portion T and an increase of the transmittance is expected at the long wavelength range.

And, it is possible to expect an effect of increasing the luminous efficiency and reducing the driving voltage, and increasing the effect of the color reproducibility by providing the second capping structure C2 in each color emission portions BE, RE and GE.

In the above described second to eleventh embodiments, the color emission portions E1, E2 and E3 are sequentially formed form the left as a blue emission portion BE, a red emission portion RE and a green emission portion GE. However, this is an example. And an arrangement order of the color emission portions may be changed, and/or an area of the specific color emission portion(s) may be made larger or the number of the specific color emission portion(s) may be the more.

Through the above experiments and the above embodiments, the inventors have confirmed that in particular, when the second capping structure C2 of the constructive interference properties at least in the blue emission portions BE is applied among color emission portions, it makes possible to display a deep blue in a display device.

The effect of improving the transparency of the first capping structure C1 having the destructive interference properties provided in the transmission portion T may be obtained as an area ratio of the first capping structure C1 occupied in the transmission portion T. In addition, the structure partially including the second capping structure C2 having the constructive interference properties in the transmission portion T may have an effect of increasing the transmittance for all wavelengths. In particular, the structure partially including the second capping structure C2 having the constructive interference properties in the transmission portion T may further improve the transmittance at a longer wavelength that the structure having only the first capping structure C1 for the transmission portion T.

Figure 16:
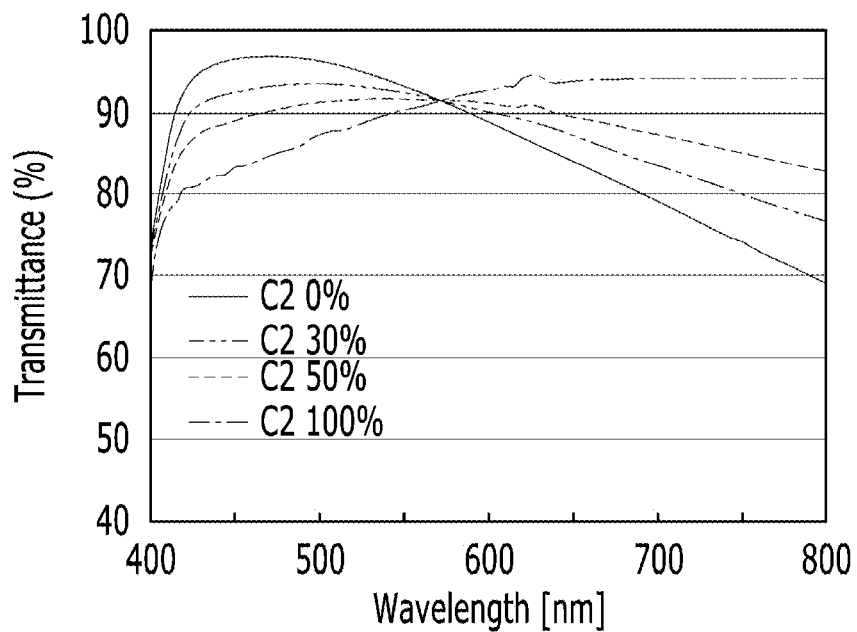
FIG. 16 is a graph illustrating transmittances for wavelength according to areas of application of a second capping layer in the transmission portion of the display device of the fourth to eleventh embodiments.

FIG. 16 is a graph illustrating transmittances for wavelength according to areas of application of a second capping layer in the transmission portion of the display device of the fourth to eleventh embodiments.

The display device of the fourth to eleventh embodiments has the second capping structure C2 of the constructive interference properties not only in the emission portions E1, E2 and E3, but also in a partial area of the transmission portion T. That is, the transmission portion T has both of the first capping structure C1 and the second capping structure C2.

Referring FIG. 16, transmittances of the transmission portion are examined according to ratios of the applied areas of the second capping structure C2 for wavelength.

As shown in FIG. 16, in the case of having only the first capping structure C1 of the destructive interference properties in the transmission portion T, without the second capping structure C2, the transmittance of the blue wavelength is high, but the transmittance of the red wavelength, which is a longer wavelength, is 90% or less.

On the contrary, in the structure which the second capping structure C2 of constructive interference properties is applied in the entire area of the transmission portion T, the lower transmittance of about 87% or less at the blue wavelength and the high transmittance of 90% or more for a wavelength of approximately 540 nm or more.

And in the structures which the second capping structure C2 of constructive interference properties are applied as 30% and 50% in the entire area of the transmission portion T, as the second capping structure C2 is increased with respect to the entire transmission portion T, the transmittance tends to be improved at the longer wavelength and the transmittance tends to be lowered at the shorter wavelength, compared to the structure having only the first capping structure C1 of the destructive interference properties in the transmission portion T.

FIG. 16 shows that the structures which the second capping structure C2 of constructive interference properties are applied as 30% and 50% in the entire area of the transmission portion T, are evenly superior for the visible light wavelength, without being biased to a specific wavelength.

That is, FIG. 16 shows that partially providing the second capping structure C2 of the constructive interference properties in the transmission portion T has evenly superior transmittance to the entire range of visible light wavelength of 440 nm to 650 nm.

On the other hand, as in the first to third embodiments of the present disclosure, a remarkable increase of the transmittance in blue wavelength can be expected even in the case of having only the first capping structure C1 having the destructive interference properties in the transmission portion T. Such embodiments are meaningful in a transparent display device in which the blue luminous characteristic is important in.

Referring FIG. 16, it can be seen that when the applied area of the constructive interference properties to the transmission portion T is 50% or less of the total area of the transmission portion T, an improved uniformity of transmittance is obtained for full visible light wavelength.

FIG. 16 is a result for the structure in which an air gap exists in the upper configuration of the capping stack 170. For example, referring the structure of the first embodiment according to FIG. 2B, there is an air space on the capping stack 170 so that reflection at the upper surface of the capping stack 170 occurs.

In the display device of the present disclosure, the structure above the capping stack 170 is not limited to a structure having an air gap. Hereinafter, an encapsulation stack is applied on the capping stack 170, so that the capping 170 and the inorganic encapsulation layer at a bottom surface of the encapsulation stack may be in contact with each other. Transmittances will be examined for structures differentiating applied area of the second capping structure C2 to the transmission portion T.

Figure 17:
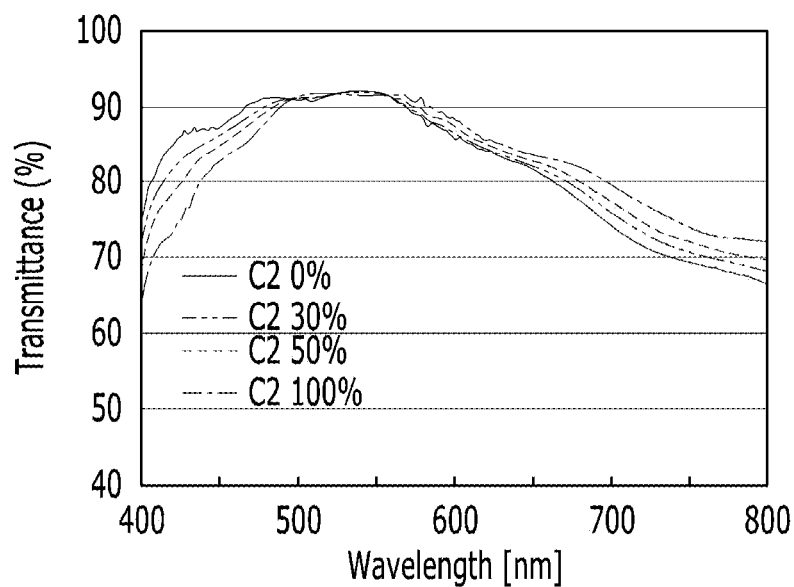
FIG. 17 is a graph illustrating transmittances for wavelength according to areas of application of a second capping layer in the transmission portion of the display device of the fourth to eleventh embodiments when an upper configuration of the capping stack is applied as an encapsulation stack.

FIG. 17 is a graph illustrating transmittances for wavelength according to areas of application of a second capping layer in the transmission portion of the display device of the fourth to eleventh embodiments when an upper configuration of the capping stack is applied as an encapsulation stack.

As shown in FIG. 17, when the encapsulation stack is applied in the upper configuration of the capping stack, regardless of the difference in areas of the second capping structure C2 of the constructive interference properties, the transmittance is high in the green wavelength 500 nm to 580 nm, and the transmittance tends to decrease in the remaining blue and red wavelengths. However, different trends are shown in the blue wavelength and the red wavelength according to the area difference of the second capping structure C2. That is, in the blue wavelength, as the area of the second capping structure C2 decreases, the transmittance increases. On the contrary, in the red wavelength, as the area of the second capping structure increases, the transmittance increases.

As shown in FIG. 17, even in the structure which the encapsulation stack is applied directly above the capping stack, by providing the second capping structure C2 50% or less of the total area of the transmission portion T, the uniformity of transmittance for all visible light wavelength can be expected.

The encapsulation stack on the capping stack may include at least one inorganic encapsulation layer and at least one organic encapsulation layer. The inorganic encapsulation layer and the organic encapsulation layer are staked alternately. If the encapsulation stack is included in the display device, an encapsulation substrate can be omitted, thus there is an advantage that the display device can be made slimmer. In the encapsulation stack, the inorganic encapsulation layer and the organic encapsulation layer, respectively, has a thickness of 1 μm or more, so that an optical refraction and interference characteristics at each internal interfaces between the inorganic encapsulation layer and the organic encapsulation layer are almost negligible. That is, in the display device of the present disclosure, there is hardly any optical influence inside the encapsulation stack.

Hereinafter, the effects of the capping stack and the upper structure will be examined through experiments.

FIGS. 18A to 18D are cross-sectional views illustrating a sixth to ninth experimental examples in which upper configurations of the capping stack are different in the transmission portions. And FIGS. 19A and 19B are graphs illustrating transmittance for wavelength in the emission portion and the transmission portion according to the sixth and seventh experimental examples.

The sixth to ninth experimental examples of FIGS. 18A to 18D commonly includes the transmission portion T as shown in FIG. 2B. The transmission portion includes the organic stack EL including the common layers 131, 133 and 134 extended from the emission portion E, and the passing electrode 140a extended from the structure of the transmissive electrode 140. Under the organic stack EL, there is the substrate 100 including the transparent protective layer.

The common layers included in the organic stack EL may be, for example, a hole injection layer, a hole transport layer, an electron blocking layer, an electron transport layer and an electron injection layer. Among them, any common layer which can be formed by a deposition mask having one open area corresponding to the entire active area, can be formed in the transmission portion T and even in the emission portion E.

Each of the sixth to ninth experimental examples includes an interfacial compensation layer 139 including a transition metal on the uppermost of the organic stack EL. The interfacial compensation layer 139 may be provided for interfacial compensation with the structure of the transmissive electrode 140. The interfacial compensation layer 139 has a configuration common to the emission portion E and the transmission portion T. The interfacial compensation layer 139 may be formed in a deposition process such as forming the common layers of the organic stack EL.

In the sixth to ninth experimental examples, an electrode having transflective electrode such as AgMg alloy is used for the structure of the transmissive electrode 140.

The sixth to ninth experimental examples have difference in the capping structure on the structure of the transmissive electrode and the upper configuration thereon. Difference will be described below.

Figure 18A:
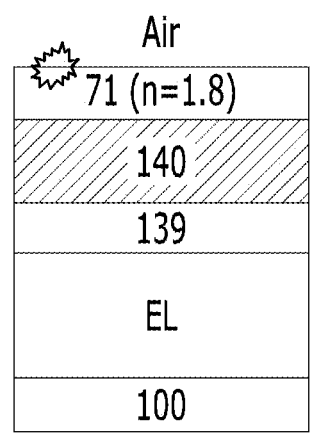
FIGS. 18A to 18D are cross-sectional views illustrating a sixth to ninth experimental examples in which upper configurations of the capping stack are different in the transmission portions.
Figure 19A:
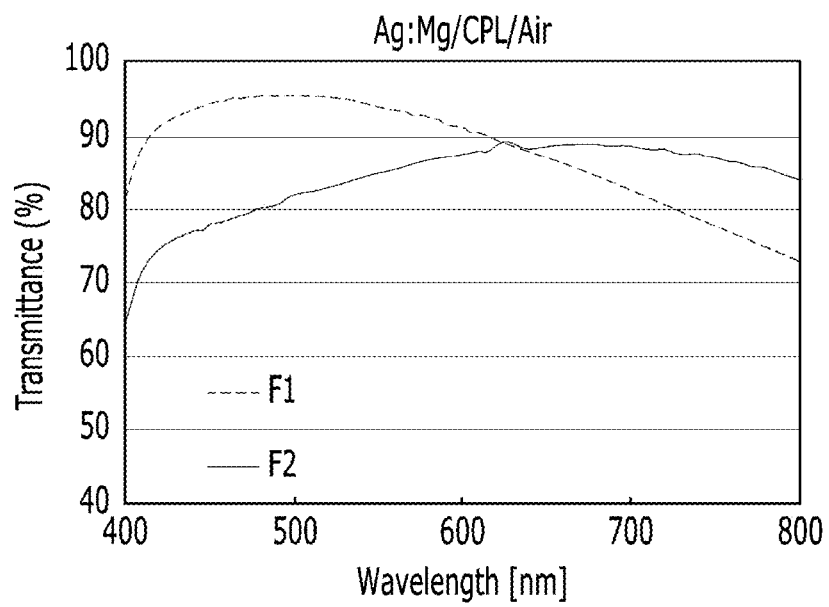
FIGS. 19A and 19B are graphs illustrating transmittance for wavelength in the emission portion and the transmission portion according to the sixth and seventh experimental examples.
Figure 19B:
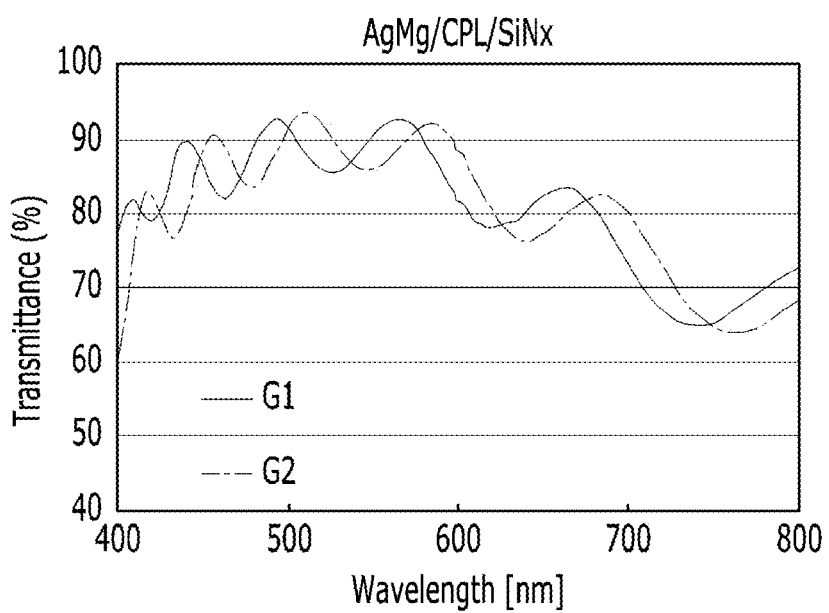

As shown in FIG. 18A, the sixth experimental example F includes a capping layer 71 having a refractive index of 1.8 on the passing electrode 140a, and air gap Air on the capping layer 71 in the transmission portion T. In the experimental example F, there is a large difference of refractive index (1.8–1.0) at the interface between the capping layer 71 and the air gap Air, thus interfacial reflection in the light traveling direction is inducted, therefore, an output light may be emitted without loss of light.

In this case, even if the capping layer 71 has the same refractive index of 1.8, but the sixth experimental example F has a different transmittance tendency depending on whether the capping layer 71 has the destructive interference properties F1 and the constructive interference properties F2. In the structure of the sixth experimental example when the capping layer 71 has the destructive interference properties F1, it has the same tendency as that of the first experimental example A described above, the transmittance at least 90% in the blue and green wavelength ranges, and the transmittance tends to be slightly lower in the red wavelength range.

In the structure of the sixth experimental example when the capping layer 71 has the constructive interference properties F2, it has the same tendency as that of the third experimental example C described above. The transmittance tends to improve from a shorter wavelength to a longer wavelength, but the transmittance is overall maintained at a level of less than 90% in the entire visible light wavelength.

That is, in the sixth experimental example F, it is possible to improve transparency in the transmission portion T and increase the color efficiencies and color reproducibility in the emission portion E by forming the capping layer 71 of the destructive interference properties in the transmission portion T and forming the light emitting element OLED of FIG. 2B in the emission portion E.

The seventh to ninth experimental examples G, H and I are the structure in which, the encapsulation stack is applied on the capping layer, respectively.

Figure 18B:
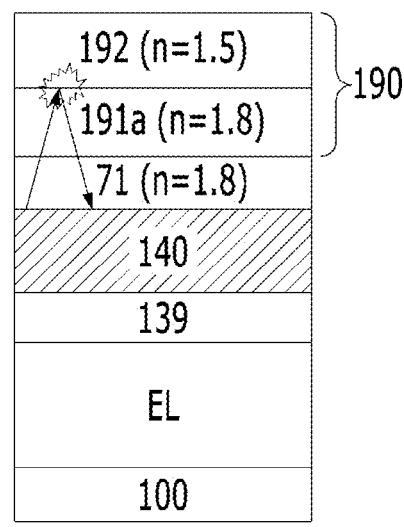

As shown in FIG. 18B, the seventh experimental example G includes a capping layer 71 having a refractive index of 1.8 on the passing electrode 140a and an encapsulation stack 190 including at least one pair of an inorganic encapsulation layer 191a and an organic encapsulation layer 192 on the capping layer 71 in the transmission portion T. The inorganic encapsulation layer 191a has a refractive index of 1.8 and the organic encapsulation layer 192 to overlay a particle has a refractive index of 1.5.

As shown in FIG. 18B, in the case in that the capping layer 71 and the inorganic encapsulation layer 191a do not have a difference in the refractive index, refraction or reflection at an interface between the capping layer 71 and the inorganic encapsulation layer 191a does not occur, and thus internal resonance cannot be generated in the capping layer 71 regardless of the capping layer 71 having the destructive interference properties G1 or the constructive interference properties G2. Accordingly, the seventh experimental example G tends to have similarly high transmittance at the green wavelength and low transmittance at the red wavelength, regardless of the capping layer 71 having the destructive interference properties G1 or the constructive interference properties G2.

That is, in the seventh experimental examples (G: G1, G2), slight refraction and an interfacial reflection occur between the inorganic encapsulation layer 191a and the organic encapsulation layer 192, but a thickness of the inorganic encapsulation layer 191a is thicker than that of the capping layer 71, thus is does not affect the slight refraction and an interfacial reflection occurred between the inorganic encapsulation layer 191a and the organic encapsulation layer 192 cannot optically affect the capping layer 71. This means that the constructive interference properties or the destructive interference properties according to the optical distance of the capping layer 71 do not affect a light emission properties of the device.

In addition, in the structure of the seventh experimental example (G: G1, G2), even if the inorganic encapsulation layer 191a and the organic encapsulation layer 192 have an interfacial reflection, there is little effect of a transmittance of the transmission portion T induced by the interfacial reflection between the inorganic encapsulation layer 191a and the organic encapsulation layer 192.

Figure 18C:
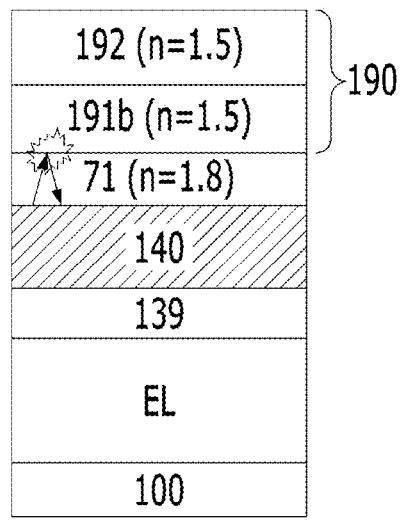

As shown in FIG. 18C, the eighth experimental example H includes a capping layer 71 having a refractive index of 1.8 on the passing electrode 140a and an encapsulation stack 190 including at least one pair of an inorganic encapsulation layer 191b and an organic encapsulation layer 192 on the capping layer 71 in the transmission portion T. In the eighth experimental examples H, the inorganic encapsulation layer 191b has a refractive index of 1.5 and the organic encapsulation layer 192 to overlay a particle has a refractive index of 1.5.

Herein, the capping layer 71 and the inorganic encapsulation layer 191b have difference in a refractive index of 0.3 and reflection occurs due to the difference in the refractive index.

For reference, reflectance of the interface between two layers having different refractive indexes $n_1$ and $n_2$ corresponds to $$\left(\frac{n_1\cos\theta_i - n_2\cos\theta_t}{n_1\cos\theta_i + n_2\cos\theta_t}\right)^2$$

($\theta_i$ being an angle of incidence and $\theta_t$ being an angle of exit).

In consideration of an angle of incidence and an angle of exit of the respective layers in the normal direction at which visibility at the front is most effective, the angle of incidence $\theta_i$ and the angle of exit $\theta_t$ may be 0°.

In this case, the reflectance between the capping layer 71 and the inorganic encapsulation layer 191b at which visibility at the front is at a level of 1%.

In the eight experimental example H, whether the capping layer 71 has the destructive interference properties H1 or the constructive properties H2, refraction or reflection occurs at the interface between the capping layer 71 and the inorganic encapsulation layer 191b, but an amount of the interfacial reflection is small, and an improvement in the transmittance is small while using the internal resonance of the capping layer 71. However, even in the structure of the eighth experimental examples H: H1, H2, the transmittance is improved at the blue wavelength when the capping layer 71 having the destructive interference properties is applied, and the transmittance is improved at the red wavelength when the capping layer 71 having the constructive interference properties is applied.

Figure 18D:
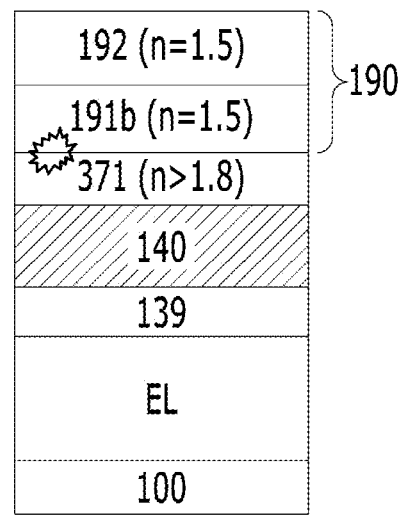

As shown in FIG. 18D, the ninth experimental example I includes a capping layer 371 having a refractive index of for an example, 2.2, on the passing electrode 140a and an encapsulation stack 190 including at least one pair of an inorganic encapsulation layer 191b and an organic encapsulation layer 192 on the capping layer 371 in the transmission portion T. In the ninth experimental examples I, the inorganic encapsulation layer 191b has a refractive index of 1.5 and the organic encapsulation layer 192 to overlay a particle has a refractive index of 1.5.

By applying the capping layer 371 having a high refractive index, compared to the sixth to eighth experimental examples F, G, H, the difference in refractive index between the inorganic encapsulation layer 191b and the capping layer 371 is increased, and thus the interface reflectance between the capping layer 371 and the inorganic encapsulation layer 191b is increased to 4.6%. Therefore, an effect of improving the transmittance in the transmission portion T due to the internal resonance of the capping layer 371 can be expected.

In the above seventh experimental example G, for an example, SiNx of the refractive index 1.8 is used in the inorganic encapsulation layer 191a. In the above eighth and ninth experimental examples H and I, for an example, SiON of the refractive index 1.5 are used in the inorganic encapsulation layer 191b.

For reference, the organic encapsulation layer 192 used in the seventh to ninth experimental examples G, H, I, has a refractive index of 1.5 in common. However, each of the organic encapsulation layer 192 and the inorganic encapsulation layer 191a/191b in the encapsulation stack 190 is thicker than the light emitting element OLED and any component of the capping stack. Therefore, even if there is a difference in refractive index between the organic encapsulation layer 192 and the inorganic encapsulation layers 191a/191b, there is almost no influence of the interfacial reflection occurred at the internal interface between the organic encapsulation layer 192 and the inorganic encapsulation layer 191a/191b. Accordingly, the inorganic encapsulation layer 191a/191b and the organic encapsulation layer 192 can be changed to various materials, if there is no optical influence of function to the emission of light from the light emitting element.

In the structure of the ninth experimental example I of FIG. 18D, the capping layer 371 of high refractive index can be formed as the first capping layer 171 of the destructive interference properties shown in FIGS. 2A to 2C. In this case, in the emission portion, the second capping layer 172 can be further provided. In this configuration, the effect of improving the transmittance in the transmission portion T and improving luminous efficiency will be described below with reference to the experimental contents.

Figure 20:
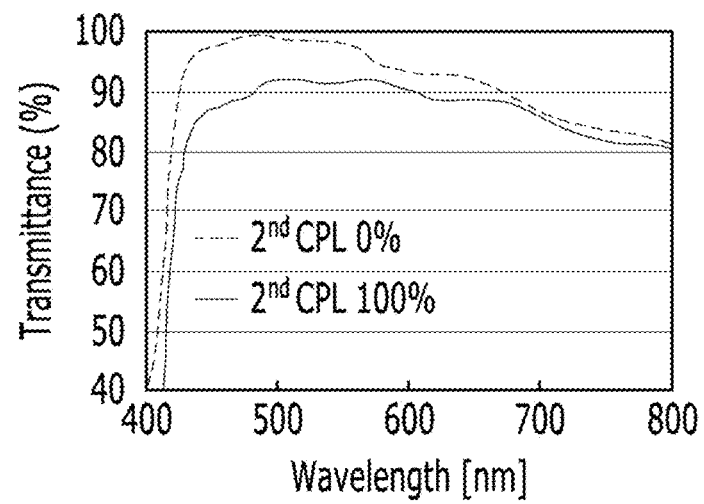
FIG. 20 is a graph illustrating transmittance for wavelength according to the ninth experimental example when the second capping layer is applied in the transmission portion or not.

FIG. 20 is a graph illustrating transmittance for wavelength according to the ninth experimental example when the second capping layer is applied in the transmission portion or not.

As shown in FIG. 20, in the structure of the ninth experimental example I, in the case 12 when the second capping layer is not applied in the transmission portion T and the second capping layer 371 having single destructive interference properties of high refractive index is applied, it can be seen that the transmittance of entire visible light wavelength has 90% or more, compared to the case 12 having the second capping layer so that the constructive interference properties in even the transmission portion T is applied.

As described above, referring the results of the ninth experimental examples I (I1 an I2), the display device of the present disclosure can be applied not only to the structure in which the air gap exists in the upper configuration of the capping stack, but also to the structure where the encapsulation stack or a face seal is provided on the capping stack. Fr an example, when the encapsulation stack is applied to the top of the capping stack, the lowest inorganic encapsulation layer of the encapsulation stack comes into contact with the capping stack. In this structure, driving voltages, luminances, conversion efficiencies and FWHMs according are examined according to applying the constructive interference properties in the emission portion E through Table 2.

In the ninth experimental example I, the following effects will be described when the capping stack has the constructive interference properties in the emission portion E.

Herein, D.I means the first capping structure C1 having the destructive interference properties, and C.I means the second capping structure C2 having the constructive interference properties.

TABLE 2

| Color emission portion | Capping structure | Driving voltage (V) | Luminance (Cd/A) | Conversion Efficiency | CIEx | CIEy | EL (Lmax) | FWHM |
|---|---|---|---|---|---|---|---|---|
| BE | D.I | 8.0 | 13.4 | 145.5 | 0.133 | 0.092 | 460 | 34.4 |
|  | C.I | 7.9 | 12.8 | 167.4 | 0.136 | 0.077 | 460 | 29.3 |
| GE | D.I | 6.8 | 208.6 | — | 0.306 | 0.663 | 530 | 49.3 |
|  | C.I | 6.6 | 210.1 | — | 0.285 | 0.678 | 530 | 38.1 |
| RE | D.I | 6.6 | 45.3 | — | 0.693 | 0.305 | 630 | 39.2 |
|  | C.I | 6.4 | 47.5 | — | 0.692 | 0.306 | 630 | 37.3 |

From Table 2, even in the structure where the encapsulation stack is applied directly on the top of the capping structure, it can be confirmed that the FWHM (full width at half maximum) may be decreased and thus cavity properties may be improved when the constructive interference (C.I) properties is applied to the emission portion BE, GE and RE. Also it can be confirmed that the FWHM (full width at half maximum) may be decreased and thus driving voltage may be relatively reduced when the constructive interference (C.I) properties is applied to the emission portion BE, GE and RE and thus it is possible to display the pure color (blue, green and red colors), compared to the structure having the capping stack of the destructive interference (D.I) properties. In particular, it can be seen that the blue conversion efficiency has improvement of 15% or more.

Figure 21:
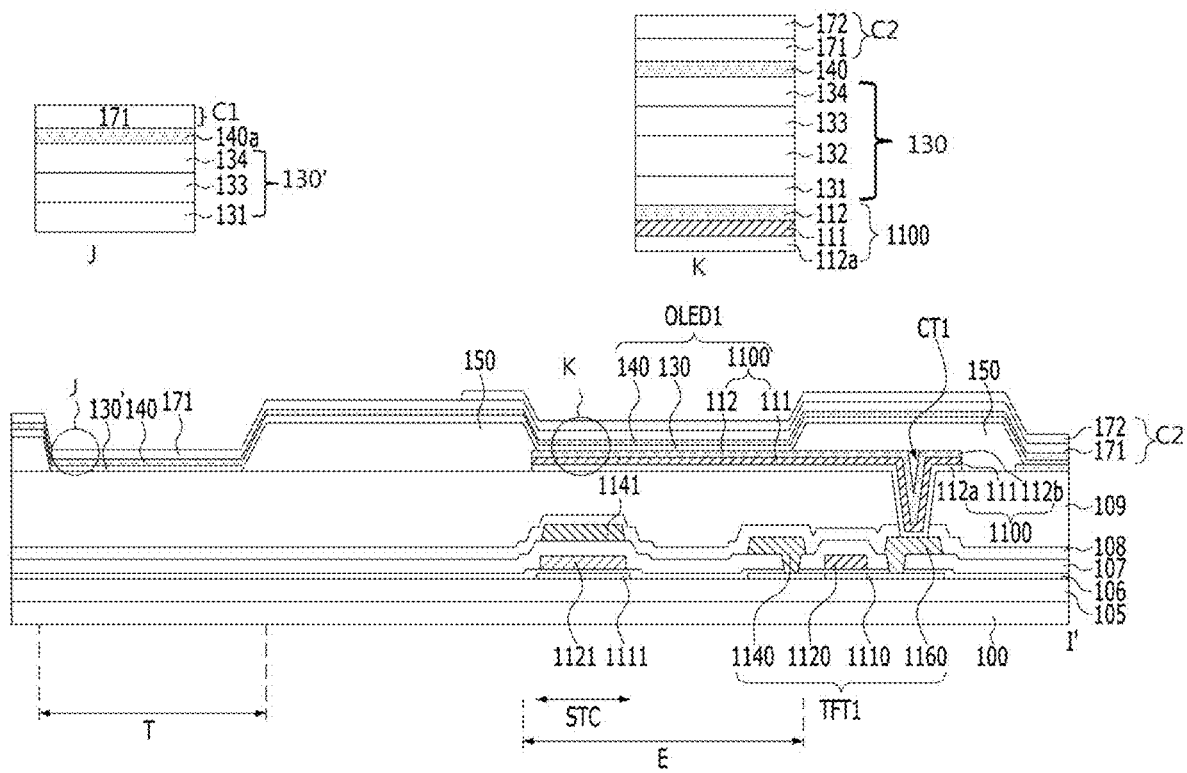
FIG. 21 is a cross-sectional view illustrating a display device according to an embodiment of the present disclosure.

Referring FIG. 21, a specific example having the light emitting element and the capping stack on the substrate in of the display device the present disclosure is described.

FIG. 21 is a cross-sectional view illustrating a display device according to an embodiment of the present disclosure.

Referring to FIG. 21 as an example, in the display device of the present disclosure, blue, red and green emission portions E1, E2 and E3 adjacent to each other in a row direction and a transmission portion T are included in the next row parallel thereto. Thus, it may be referred to as a pixel P and the pixel P is disposed on the substrate 100 in a plurality of rows and columns. And a thin film transistor TFT1, TFT2, TFT3 is provided at each color emission portions E1, E2 and E3 so that the each color emission portions may function as an independently driven sub-pixel.

A blue light emitting layer 132a is provided at a blue emission portion BE. A red light emitting layer 132b is provided at a red emission portion RE. A green light emitting layer 132c is provided at a green emission portion GE.

The first thin film transistor TFT1 in the emission portion E (RE, GE, BE) includes a first gate electrode 1120 formed in the same layer as the scan lines SL, a first semiconductor layer 1110 provided with a channel region overlapping the first gate electrode 1120, and a first source electrode 1140 and a first drain electrode 1160 connected to both sides of the first semiconductor layer 1110. Further, the first gate electrode 1120 may be formed as a protrusion pattern protruding from the scan line SL to be formed integrally with the scan line SL. The first source electrode 1140 may be formed as a protrusion pattern protruding from the data line DL, and the first drain electrode 1160 is spaced apart from the first source electrode 140 and connected to the reflective anode 1100 of the organic light emitting diode OLED through a first connection part CT1.

Referring to FIG. 21, the layered structure of the display device will be described in detail, as follows.

A buffer layer 105 is provided over the transparent substrate 100, and first, second and third semiconductor layers 1110 and 1111 are provided over the buffer layer 105. The buffer layer 105 serves to prevent impurities remaining in the transparent substrate 100 from being introduced into the semiconductor layers 1110 and 1111. The semiconductor layers 1110 and 1111 may be amorphous or crystalline silicon semiconductor layers, or transparent oxide semiconductor layers. Further, both sides of the first semiconductor layer 1110 connected to the first and second source electrodes 1140 and the first and second drain electrodes 1160, and an entire region of the second semiconductor layer 1111 may be regions into which impurities are injected, and intrinsic regions of the first semiconductor layer 1110 between the impurity injected regions may function as the channel regions.

The second semiconductor layer 1111 may be located to overlap storage electrodes 1121 and 1141 which will be formed thereon, and be used as an auxiliary storage electrode which increases the capacitance of a storage capacitor STC if impurities are injected. Otherwise, as circumstances require, the third semiconductor layer 1111 may be omitted.

Further, a gate insulating film 106 is provided to overlay the first and second semiconductor layers 1110 and 1111, and the gate electrodes 1120 and the first storage electrode 1121 respectively overlapping the intrinsic regions of the first semiconductor layer 1110 and the second semiconductor layer 1111 are formed.

A first interlayer insulating film 107 is provided to overlay the first and second semiconductor layers 1110 and 1111, the gate electrodes 1120 and the first storage electrode 1121.

Contact holes are formed by selectively removing the first interlayer insulating film 107 and the gate insulating film 106 from both sides of the first semiconductor layer 1110, and the first source electrode 1140 and the first drain electrode 1160 are connected to the first semiconductor layer 1110 and the second source electrode 1161 and the second drain electrode 1142 are connected to the second semiconductor layer 1112 through the contact holes. In the same process, the second storage electrode 1141 is formed over the first interlayer insulating film 107 overlapping the first storage electrode 1121.

Here, the first thin film transistor TFT to drive the light emitting element OLED provided in the emission portion E (E1, E2 and E3) includes the first semiconductor layer 1110, the first gate electrode 1120 provided with the channel region overlapping the first semiconductor layer 1110, and the first source electrode 1140 and the first drain electrode 1160 connected to both sides of the first semiconductor layer 1110, which are sequentially stacked from below.

Further, the storage capacitor STC includes the first and second storage electrodes 1121 and 1141 overlapping each other with the first interlayer insulating film 107 interposed therebetween.

A second interlayer insulating film 108 is formed to overlay the first and second thin film transistors TFT1 and TFTS and the storage capacitor STC.

Here, the first film transistors TFT and the storage capacitor STC include light-shielding metal layers and are disposed so as not to overlap the transmission portion T, and thus, the thin film transistors TFT may be disposed so as to overlap the emission portion E (E1, E2, E3) or a region for forming the bank 150. Here, the bank 150 may be located between the transmission portion T and the emission portion E, or be located between emission areas of the emission portions E which are spaced apart from each other.

In the emission portion E, the reflective anode 1100 allows the metal layers disposed thereunder to be invisible and, in a region where the bank 150 is located, the thick bank 150 allows the elements disposed thereunder to be invisible.

Further, a planarization film 109 may be formed to planarize the surface of the second interlayer insulating film 108 while overlaying the second interlayer insulating film 108, the first and second connection parts CT1 and CT2 may be formed by selectively removing the planarization film 109 and the second interlayer insulating film 108, and the thin film transistor TFT may be connected to the reflective anode 1100 and the transparent electrode 1200 through the first and second connection parts CT1 and CT2.

The display device in accordance with the present disclosure may further include a partition wall (not shown) in designated regions of portions where the transmission portions T and the emission portions E are not located, and the partition wall divide the adjacent transmission portions T or emission portions E. The partition wall prevents a deposition mask (not shown) used for deposition of an organic material when the organic stacks 130 and 130' are formed from directly contacting the bank 150, and thus maintains the form of the bank 150 without collapse of the bank 150.

The partition wall may include a first layer formed in the same layer as the bank 150 and a second layer having a designated height from the upper surface of the first layer so as to overlay the first layer. In order to prevent the deposition mask, required to form the organic common layer or the light emitting layer, from directly contacting the bank 150 or sagging after formation of the bank 150, the second layer may be formed in the same layer as a spacer (not shown) formed over the bank 150.

In the emission portion E, the reflective anode 1100 and the structure of the transmissive electrode 140 are disposed opposite to each other. Here, the reflective anode 1100 is illustrated as having a three-layered structure having the reflective electrode layer 111 and the upper and lower transparent electrode layers 112b and 112a, but is not limited thereto. That is, one or both of the transparent electrode layers 112b and 112a may be omitted, or a plurality of transparent electrode layers 112b and 112a and a plurality of reflective electrode layers 111 may be provided. If the reflective anode 1100 includes at least one transparent electrode layer, the transparent electrode 1200 in the transmission portion T may be formed through the same process as the transparent electrode layer.

Although the above-described example describes the organic light emitting diode OLED provided in the emission portion E as a single stack including a single organic light emitting layer in each subpixel, an organic light emitting diode including a plurality of stacks, each of which includes a light emitting layer, is applicable to the display device in accordance with the present disclosure.

Hereinafter, one or more embodiments in which an organic stack between electrodes of light emitting elements is formed as a plurality of stacks will be described.

Figure 22:
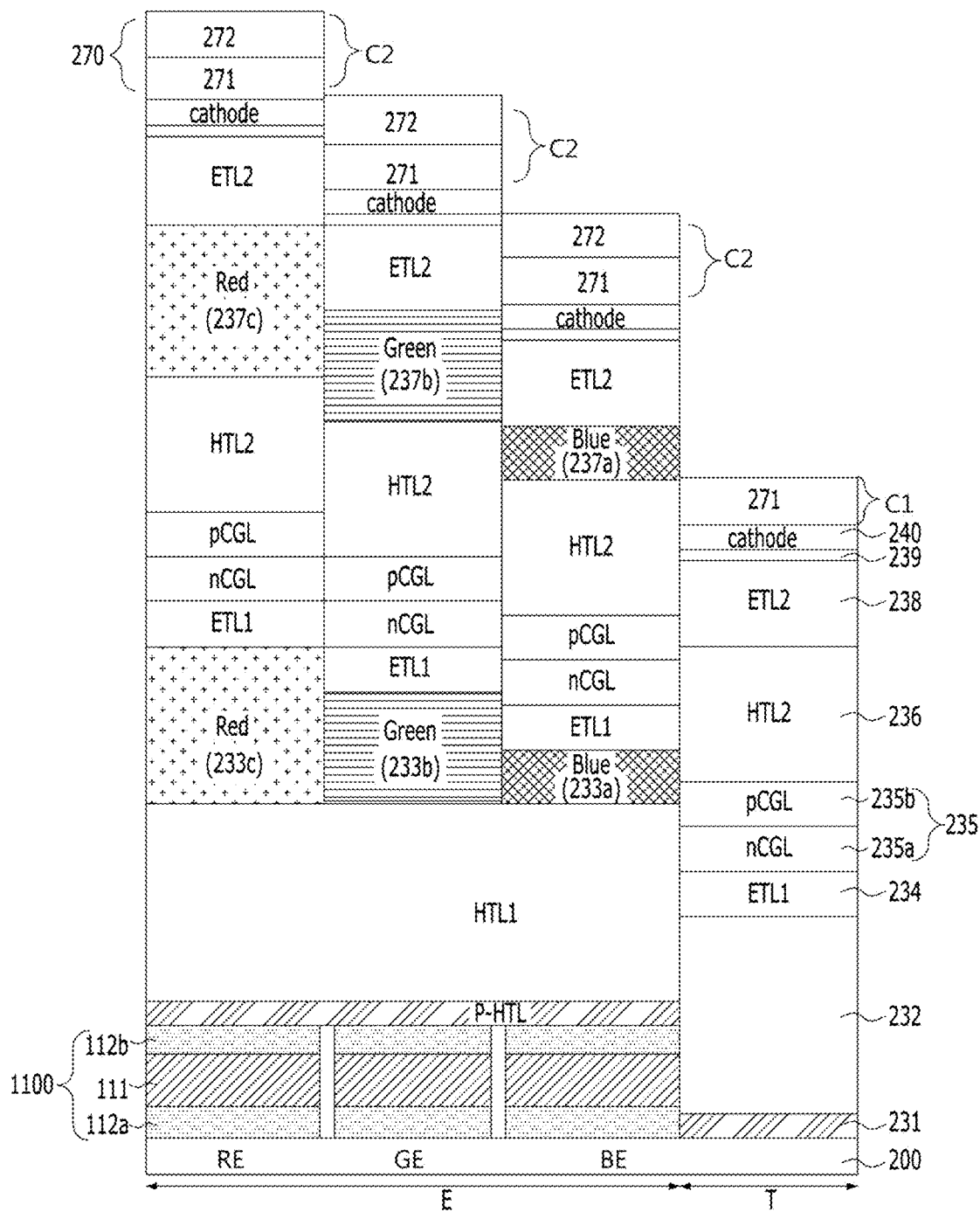
FIG. 22 is a cross-sectional view illustrating a display device according to a twelfth embodiment of the present disclosure.

FIG. 22 is a cross-sectional view illustrating a display device according to a twelfth embodiment of the present disclosure.

As shown in FIG. 22, the display device in accordance with the twelfth embodiment of the present disclosure has two stacks on the substrate 200. Each stack is divided by a charge generation layer 235. A display device including the spirit of the present disclosure is not only an example including the two stacks shown, examples with more than three stacks are possible.

A plurality of insulating layers including the thin film transistor may be further included between the substrate and the light emitting elements described in the above. FIG. In the illustrated example, remaining configurations are omitted to focus the relationship between the internal configuration of the light emitting elements and the capping stack.

Emission portion E (RE, GE and BE) are firstly explained.

In each emission portion E (RE, GE and BE), a reflective electrode anode 1100 and a transmissive electrode cathode 240 are opposed to each other, and a plurality of stacks are provided therebetween.

The reflective anode 1100 may have transparent electrodes 112a and 112b under and over a reflective electrode 111. A transparent electrode among the transparent electrodes 112a and 112b may be omitted. In some case, the reflective anode 110 may be singly formed.

In addition, the transmissive electrode cathode 240 may have reflective transmittance. The transmissive electrode cathode 240 may be formed, for an example, of AgMg alloy. It is possible to resonate light between the reflective electrode anode 1100 and the transmissive electrode cathode 240, light may be transmitted with a high degree in an optimum wavelength range having a thin FWHM through resonance repeated a plurality of times. In the spirit of the display device of the present disclosure, a transmissive electrode cathode 240 may be replaces with a transparent electrode such as ITO or IZO.

Each stack may be divided by the charge generation layer 235.

The each stack basically includes a hole transport layer 232 and 236, an light emitting layer 233a, 233b or 233c/237a, 237b or 237c, an electron transport layer 234 and 238. A hole injection layer 231 may be further provided on a side close to the reflective electrode anode 1100 and an electron injection or an interfacial compensation layer 239 may be further provided adjacent to the transmissive electrode cathode 240.

In this embodiment describes an example, in which the organic light emitting layers 233a, 233b and 233c/237a, 237b and 237c to emit light of the same color are applied to the respective stacks in order to improve color efficiencies at the red, green and blue color emission portions RE, GE and BE. However, this is an example, and in some cases, the light emitting layers may be provided with different color emitting layers in the different stacks, so that various colors can be expressed even in one emission area.

In the light emitting element, the other layers except the reflective electrode anode 1100 and the light emitting layers 233a, 233b and 233c/237a, 237b, and 237c may be formed without distinction in the active area, thus they may be formed in the transmission portion T, with the emission portion E.

That is, the hole injection layer 231, the hole transport layer 232 and 236, the electron transport layer 234 and 238, the charge generation layer 235 (the p-type charge generation layer (235a), the n-type charge generation layer (235b)), the interfacial compensation layer or the electron injection layer 239 and the transmissive electrode cathode 240 are common layers without dividing the emission portion E and the transmission portion T.

In FIG. 22, in order to clarify the difference in the layered structure among respective color emission portions RE, GE and BE and the transmission portion T, a bank (Please refer 150 in FIG. 1) is not shown. However, the bank may be also applied among respective color emission portions RE, GE and BE and the transmission portion T in the twelfth embodiment. In this case, the bank may be provided between the reflective electrode anode 100 and the hole injection layer 231, by overlapping edges of the reflective electrode anode 100.

In the display device in accordance with the present disclosure, the first capping structure C1 having the destructive interference properties is provided in a part of the transmission portion T and the second capping structure C2 having the constructive interference properties is provided in the emission portion E. The first capping structure C1 includes a single first capping layer 171 and the second capping structure C2 includes the first and second capping layers 171 and 172 stacked. The first capping layer 171 is entirely formed in the active area and the second capping layer 172 is selectively formed in the active area.

In some cases, the second capping structure C2 may occupy 50% or more to an entire area of the transmission portion T, so uniformity of transparency in all visible light wavelength is improved by increasing the transmittance in the longer wavelength range.

In some case, it is possible to apply a first part as an island shape in a part of the emission portion E and a second part in the transmission portion T with the second capping structure C2 of the constructive interference properties, and the first capping structure C1 of the destructive interference properties in the remaining area. In this case, the second capping layer 172 included in the second capping structure C2 may be formed with a deposition mask of a mixed type of a slot type and/or a grilled type.

Even in the twelfth embodiment of the display device, the first capping structure C1 having the destructive interference properties may be provided in the transmission portion T and the second capping structure C2 having the constructive interference properties may be provided in the emission portion E. So the aforementioned effects of improving the transmittance of the transmission portion and improving the color efficiency, improving the color reproducibility and reduction the driving voltage of the emission portions are together anticipated and furthermore increasing the lifespan can be obtained.

Further aspects of the present disclosure may be provided. A display device according to an embodiment of the present disclosure may comprise a plurality of emission portions and a plurality of transmission portions on a substrate, a light emitting layer in the emission portions, a reflective electrode structure between the light emitting layer and the substrate, in each of the emission portions, a transmissive electrode located over the light emitting layer throughout the emission portions and the transmission portions of the substrate and a capping stack on the transmissive electrode, the capping stack comprising a first capping structure over the transmission portion and a second capping structure over the emission portion, the second capping structure different from the first capping structure.

The first capping structure may have a first optical distance through which a light passing through the transmissive electrode is destructively interfered and transmitted, and the second capping structure may have a second optical distance through which a light passing through the transmissive electrode is constructively interfered and transmitted.

The capping stack may include a first capping layer over the emission portions and the transmission portions continuous and a second capping layer on the first capping layer selectively in the second capping structure.

In the capping stack, the first capping layer may have destructive interference properties, and a stack of the first capping layer and the second capping layer may have constructive interference properties.

The first capping structure may comprise the first capping layer of the destructive interference properties. And the second capping structure may comprise the first capping layer and a second capping layer on the first capping layer having a different optical distance from the first capping layer. The first capping layer may be continuous over the emission portions and the transmission portions.

The capping stack may further comprise the second capping layer at a part of the transmission portions, and a step between a region having the second capping layer and a region having only the first capping layer in the transmission portion.

The emission portions and the transmission portions may be parallel and the emission portions may include a blue emission part, a red emission part and a green emission part.

The second capping layer may be provided on at least the blue emission part.

The blue emission part and the green emission part may be alternately arranged with the red light emission part interposed therebetween, and the red emission part may have a smaller area than each of the blue emission part and the green emission part.

The second capping layer may be overlapped with the emission portion and extended to a part of the transmission portion adjacent to the emission portion.

The second capping layer of the capping stack may overlap the blue emission part, the red emission part, the green emission part and a part of the transmission part adjacent to the blue emission part, the red emission part and the green emission part on the substrate.

The display device may further comprises an inorganic protective layer on the capping stack, the inorganic protective layer having a refractive index of 0.2 or more different from that of the first capping layer.

A display device according to a different embodiment of the present disclosure may include a plurality of red emission portions, a plurality of green emission portions, a plurality of blue emission portions and a plurality of transmission portions on a substrate, a bank among the red emission portions, the green emission portions, the blue emission portions and the transmission portions, a light emitting element in each of the red emission portions, the green emission portions, and the blue emission portions, the light emitting element having a reflective electrode structure, a light emitting layer and a transmissive electrode, a passing electrode in each of the transmission portions, the passing electrode extended from the transmission electrode and a capping stack on the transmissive electrode and the passing electrode, the capping stack comprising a first capping structure over at least part of the transmission portions and a second capping structure over at least part of the red emission portions, the green emission portions, and the blue emission portions, the second capping structure different from the first capping structure.

The capping stack may include the second capping structure on at least the blue emission parts.

The second capping structure may overlap the an entirety of the blue emission parts and transmission portions adjacent to the blue emission parts, and the second capping structure may further overlap at least one of the green emission parts and the red emission parts.

The display device may further comprise an air gap on the capping structure.

The display device may further comprise an inorganic protective layer on the capping stack, the inorganic protective layer having a refractive index of 0.2 or more different from that of the first capping layer.

In the capping stack, the first capping structure may have the destructive interference properties, and the second capping structure may have the constructive interference properties.

The first capping structure may comprise the first capping layer of the destructive interference properties. And the second capping structure may comprise the first capping layer and a second capping layer on the first capping layer having a different optical distance from the first capping layer. The first capping layer may be continuous over the emission portions and the transmission portions.

The capping stack may include a first capping layer integrally provided on the transmissive electrode and the passing electrode, over the emission portions and the transmission portions and a second capping layer selectively on the first capping layer, in the second capping structure.

The transmissive electrode and the passing electrode may include at least one of a transflective metal and a transparent metal.

The display device may further comprise a third capping layer in a part of the transmission portions on a same layer as the second capping layer, the third capping layer parallel to at least one of arrangement directions of the red emission parts, the green emission parts, and the blue emission parts.

The red, green and blue emission portions may be arranged in a first direction. The first capping layer may be integral over the red, green and blue emission parts and the transmission portions, and the second capping layer may overlap the blue emission parts, and further comprises a plurality of emitting capping parts spaced apart from each other in the first direction.

The second capping layer may further comprise at least one transmissive capping part parallel to the emitting capping parts, by crossing the transmission portion.

The blue emission portions and the transmissive portions may be alternately arranged in a second direction. And the second capping layer may comprise a plurality of emitting capping parts spaced apart from each other in the second direction, each emitting capping part overlapping at least one of the blue emission portions.

Each emitting capping part of second capping layer may overlap with at least one blue emission portion and at least a part of the transmission portion adjacent to the blue emission portion in the second direction.

The display device of the present disclosure has a capping structure including the constructive interference properties in the emission portion and thus it improves the cavity properties of the EL spectrum of each color wavelengths even in the structure without color filters. At the same time, the display device of the present disclosure has the capping structure including the destructive interference properties in the transmission portion, and thus transparency and transmittance are improved in the transmission portion.

Also, the display device of the present disclosure may improve color purity and cavity properties in the emission portion and driving voltage of the device can be reduced and thus life span of the display device can be improved.

As apparent from the above description, a display device in accordance with the present disclosure has effects as follows.

First, a capping stack includes a first capping structure having the constructive interference properties in the emission portion to increase cavity characteristics of each wavelength of red, green and blue colors, and a second capping structure having the destructive interference properties in the transmission portion in order to improve transmittance. That is, the capping stack in the display device can increase color purities of red, green and blue colors, without color filter and simultaneously improve the transmittance in the transmission portion, by applying a hybrid capping structure.

Second, in the emission portion, the device efficiency can be improved by increasing the color purities and cavity characteristics, it is possible to reduce a driving voltage and thus improve a life-span.

Third, by improving the efficiency of the emission portions, an area of the emission portion can be reduced. As a result, it is possible to increase the transmission portion, thereby improving the transmittance of the structure itself.

Fourth, the capping structure of the transmission portion is a single layer having the destructive interference properties. That is, in the capping structure, it is possible to improve light transmittance by reducing or minimizing amount of light totally internally reflected in the capping structure and increasing amount of light emitted. Accordingly, in a same structure, transmittance can be improved without increasing the area of the transmission portion and without changing the area of the emission portion in the display device.

It will be apparent to those skilled in the art that various modifications and variations can be made in the present disclosure without departing from the spirit or scope of the disclosure. Thus, it is intended that the present disclosure include the modifications and variations of this disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate;
   a plurality of emission portions and a plurality of transmission portions on the substrate;
   a light emitting layer in the plurality of emission portions;
   a reflective electrode structure between the light emitting layer and the substrate, in each of the plurality of emission portions;

a transmissive electrode located over the light emitting layer throughout the plurality of emission portions and the plurality of transmission portions of the substrate; and a capping stack on the transmissive electrode, the capping stack including:
  a first capping layer over an entire area of all of the plurality of transmission portions and all of the plurality of emission portions; and
  a second capping layer on the first capping layer over at least one of the plurality of emission portions,
wherein an entirety of the second capping layer overlaps the first capping layer and an area of the second capping layer is smaller than that of the first capping layer, and
wherein the capping stack further incudes the second capping layer at a part of the plurality of transmission portions, and a step between a region having the second capping layer and a region having only the first capping layer in the plurality of transmission portions.

2. The display device according to claim 1,
wherein the first capping layer on the plurality of transmission portions has a first optical distance through which a light passing through the transmissive electrode is destructively interfered and transmitted, and
wherein the capping stack including the first capping layer and the second capping layer on the plurality of emission portions has a second optical distance through which a light passing through the transmissive electrode is constructively interfered and transmitted.

3. The display device according to claim 1, wherein the second capping layer is divided into a plurality of islands for each of the plurality of emission portions.

4. The display device according to claim 1,
wherein the plurality of emission portions and the transmission portions are parallel,
wherein the plurality of emission portions include a plurality of blue emission portions, a plurality of red emission portions, and a plurality of green emission portions,
wherein the second capping layer is provided on at least the plurality of blue emission portions, and
wherein the second capping layer is not present on at least a part of the plurality of red emission portions and the plurality of green emission portions.

5. The display device according to claim 4, wherein the second capping layer is overlapped with the plurality of emission portions and extended to a part of the plurality of transmission portions adjacent to the plurality of emission portions.

6. The display device according to claim 1,
wherein the plurality of emission portions include a blue emission portion, a red emission portion, and a green emission portion, and
wherein the blue emission portion and the green emission portion are alternately arranged with the red light emission portion interposed therebetween, and
wherein the red emission portion has a smaller area than each of the blue emission portion and the green emission portion.

7. The display device according to claim 1,
wherein the plurality of emission portions and the plurality of transmission portions are parallel,
wherein the plurality of emission portions include a blue emission portion, a red emission portion, and a green emission portion, and
wherein the second capping layer overlaps the blue emission portion, the red emission portion, the green emission portion, and a part of the plurality of transmission portions adjacent to the blue emission portion, the red emission portion and the green emission portion on the substrate.

8. The display device according to claim 1, further comprising an inorganic protective layer on the capping stack, the inorganic protective layer having a refractive index of 0.2 or more different from that of the first capping layer.

9. A display device, comprising:
  a substrate;
  a plurality of red emission portions, a plurality of green emission portions, a plurality of blue emission portions and a plurality of transmission portions on the substrate;
  a bank among the red emission portions, the green emission portions, the blue emission portions, and the transmission portions;
  a light emitting element in each of the red emission portions, the green emission portions, and the blue emission portions, the light emitting element having a reflective electrode structure, a light emitting layer, and a transmissive electrode;
  a passing electrode in each of the transmission portions, the passing electrode extended from the transmission electrode; and
  a capping stack on the transmissive electrode and the passing electrode, the capping stack including:
    a first capping layer over an entire area of the transmission portions, the red emission portions, the green emission portions, and the blue emission portions;
    a second capping layer on the first capping layer; and
    a step between a region having the second capping layer and a region having only the first capping layer in the transmission portions,
  wherein an area of the second capping layer is smaller than the first capping layer; and
  wherein the second capping layer is provided on at least the blue emission portion and at a part of the plurality of transmission portions, and the second capping layer is not present on at least a part of the red emission portion and the green emission portion.

10. The display device according to claim 9, wherein the second capping layer is provided on at least the blue emission portions, and
wherein the second capping layer overlaps an entirety of the blue emission portions and transmission portions adjacent to the blue emission portions, and
wherein the second capping layer further overlaps at least one of the green emission portions and the red emission portions.

11. The display device according to claim 9, further comprising an air gap on the capping structure.

12. The display device according to claim 9, further comprising an inorganic protective layer on the capping stack, the inorganic protective layer having a refractive index of 0.2 or more different from that of the first capping layer.

13. The display device according to claim 9, wherein in the capping stack,
  the first capping layer has destructive interference properties, and
  the capping stack of the first capping layer and the second capping layer has constructive interference properties, and
  wherein the first capping layer is integrally provided on the transmissive electrode and the passing electrode.

14. The display device according to claim 13,
wherein the red, green and blue emission portions are arranged in a first direction, and
wherein the first capping layer is integral over the red, green, and blue emission portions and the transmission portions, and
the second capping layer overlaps the blue emission portions, and further includes a plurality of emitting capping parts spaced apart from each other in the first direction.

15. The display device according to claim 14, wherein the second capping layer further includes at least one transmissive capping part parallel to the emitting capping parts, by crossing the transmission portion.

16. The display device according to claim 13,
wherein the blue emission portions and the transmissive portions are alternately arranged in a second direction, and
wherein the second capping layer includes a plurality of emitting capping parts spaced apart from each other in the second direction, each emitting capping part overlapping at least one of the blue emission portions.

17. The display device according to claim 16, wherein each emitting capping part overlaps with at least one blue emission portion and at least a part of the transmission portion adjacent to the blue emission portion in the second direction.

18. The display device according to claim 9,
wherein the second capping layer has a plurality of island-typed patterns for the red emission portions, the green emission portions, and the blue emission portions and a linear type pattern on a part of the transmission portions along a length direction of the transmission portions.

19. The display device according to claim 9,
wherein the first capping layer overlaps with an entire area of the transmission portions, the red emission portions, the green emission portions, and the blue emission portions and
wherein an entire area of the second capping layer is in contact with the first capping layer.

20. A display device, comprising:
a substrate;
a plurality of emission portions and a plurality of transmission portions on the substrate;
a light emitting layer in the plurality of emission portions;
a reflective electrode structure between the light emitting layer and the substrate, in each of the plurality of emission portions;
a transmissive electrode located over the light emitting layer throughout the plurality of emission portions and the plurality of transmission portions; and
a capping stack on the transmissive electrode over a first area including at least two adjacent emission portions and one transmission portion between the two adjacent emission portions, the capping stack including:
a first capping layer over an entire area of both the plurality of transmission portions and the plurality of emission portions; and
a second capping layer on the first capping layer over the plurality of emission portions,
wherein with the first area, an entirety of the second capping layer overlaps the first capping layer and
wherein the capping stack further includes a step between a region having the second capping layer and a region having only the first capping layer in the plurality of transmission portions.

\* \* \* \* \*

UNITED STATES PATENT AND TRADEMARK OFFICE
CERTIFICATE OF CORRECTION

| | | |
|---|---|---|
| PATENT NO. | : 11,882,715 B2 | Page 1 of 1 |
| APPLICATION NO. | : 17/011920 | |
| DATED | : January 23, 2024 | |
| INVENTOR(S) | : Jae-Hyeon Kim et al. | |

It is certified that error appears in the above-identified patent and that said Letters Patent is hereby corrected as shown below:

In the Claims

Column 39, Claim 1, Line 15:
"further incudes the"
Should read:
--further includes the--.

Column 42, Claim 20, Line 31:
"haying only"
Should read:
--having only--.

Signed and Sealed this
Thirtieth Day of July, 2024

Katherine Kelly Vidal
*Director of the United States Patent and Trademark Office*